(12) United States Patent
Kubo et al.

(10) Patent No.: US 12,557,599 B2
(45) Date of Patent: Feb. 17, 2026

(54) SEMICONDUCTOR MANUFACTURING APPARATUS

(71) Applicant: Kioxia Corporation, Tokyo (JP)

(72) Inventors: Makoto Kubo, Mie (JP); Masaharu Takizawa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 666 days.

(21) Appl. No.: 17/870,582

(22) Filed: Jul. 21, 2022

(65) Prior Publication Data

US 2023/0290669 A1 Sep. 14, 2023

(30) Foreign Application Priority Data

Mar. 14, 2022 (JP) .................. 2022-039499

(51) Int. Cl.
*H01L 21/687* (2006.01)
*H01J 37/32* (2006.01)

(52) U.S. Cl.
CPC .. *H01L 21/68785* (2013.01); *H01J 37/32091* (2013.01); *H01J 37/3244* (2013.01); *H01J 37/32568* (2013.01); *H01J 37/32715* (2013.01); *H01L 21/68742* (2013.01); *H01J 2237/2007* (2013.01)

(58) Field of Classification Search
CPC ......... H01L 21/68785; H01L 21/68742; H01L 21/67017; H01J 37/32091; H01J 37/3244; H01J 37/32568; H01J 37/32715; H01J 2237/2007; H01J 2237/3321; C23C 16/455
See application file for complete search history.

(56) References Cited

U.S. PATENT DOCUMENTS

| | | | |
|---|---|---|---|
| 5,192,371 A * | 3/1993 | Shuto | C23C 16/4582 118/500 |
| 5,534,110 A | 7/1996 | Lenz et al. | |
| 6,444,027 B1 * | 9/2002 | Yang | C30B 25/12 117/88 |
| 7,198,677 B2 * | 4/2007 | Yoo | H01L 21/6708 156/345.23 |
| 7,960,254 B2 * | 6/2011 | Wada | C23C 16/4411 118/728 |

(Continued)

FOREIGN PATENT DOCUMENTS

| | | |
|---|---|---|
| JP | H09-501267 A | 2/1997 |
| JP | 2020-077751 A | 5/2020 |

(Continued)

*Primary Examiner* — Aiden Lee
(74) *Attorney, Agent, or Firm* — Foley & Lardner LLP

(57) ABSTRACT

A semiconductor manufacturing apparatus includes a process container. A holder is disposed in the process container, and is arranged to hold a substrate including a first surface and a second surface on an opposite side to the first surface. The holder includes a mask portion that covers a first area of the first surface and exposes a second area different from the first area. The mask portion includes a first layer in contact with the first surface of the substrate and a second layer spaced further from the substrate than the first layer. The first layer is recessed further than the second layer in a direction toward the first area in an edge portion of the mask portion that partitions the first area and the second area.

20 Claims, 35 Drawing Sheets

(56) References Cited

U.S. PATENT DOCUMENTS

| | | | |
|---|---|---|---|
| 8,088,225 B2 * | 1/2012 | Goodman | H01J 37/32871 |
| | | | 156/345.52 |
| 9,070,731 B2 * | 6/2015 | Tachibana | H01L 21/68721 |
| 2019/0062918 A1 | 2/2019 | Shaikh et al. | |
| 2019/0145001 A1 | 5/2019 | Park et al. | |
| 2021/0108314 A1 | 4/2021 | Shaikh et al. | |
| 2021/0301402 A1 | 9/2021 | Suzuki et al. | |
| 2021/0388500 A1 | 12/2021 | Shimabukuro et al. | |
| 2022/0010424 A1 | 1/2022 | Suzuki et al. | |

FOREIGN PATENT DOCUMENTS

| | | |
|---|---|---|
| JP | 2023-121060 A | 8/2023 |
| WO | WO-2020/095787 A1 | 5/2020 |

* cited by examiner

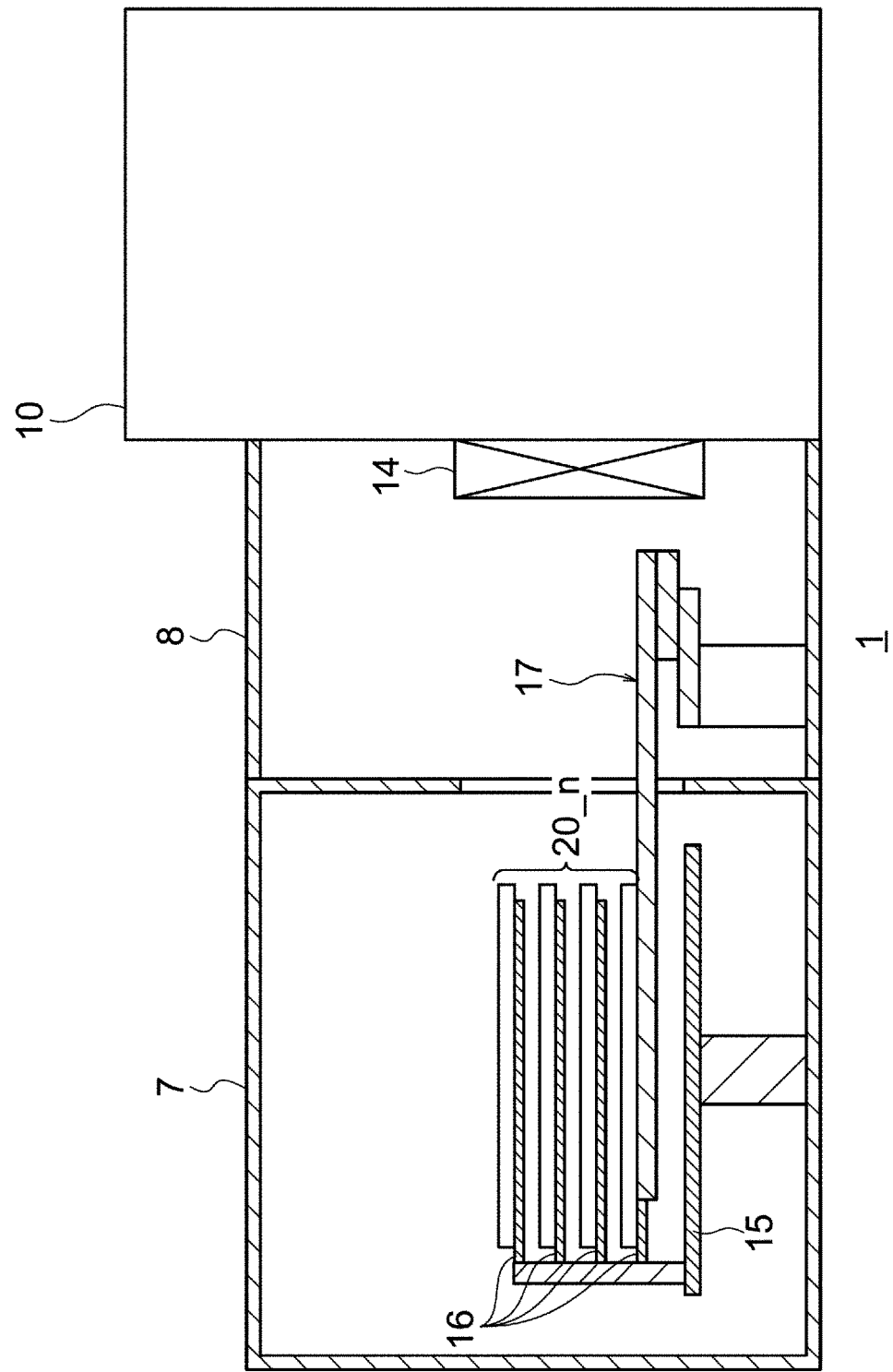

SEMICONDUCTOR MANUFACTURING APPARATUS

CROSS-REFERENCE TO RELATED APPLICATION(S)

This application is based upon and claims the benefit of priority from Japanese Patent Application No. 2022-039499, filed Mar. 14, 2022, the entire contents of which are incorporated herein by reference.

FIELD

Embodiments described herein relate generally to a semiconductor manufacturing apparatus.

BACKGROUND

A semiconductor storage device, such as a NAND-type flash memory, may include a three-dimensional memory cell array obtained by three-dimensionally locating a plurality of memory cells. A semiconductor substrate including such a three-dimensional memory cell array may warp in an extending direction of the word line. It is concerned that the warpage of the semiconductor substrate affects yields and hinders the transfer of the semiconductor substrate in a semiconductor manufacturing process.

DESCRIPTION OF THE DRAWINGS

FIG. 60 is a diagram illustrating an example of the semiconductor manufacturing apparatus including a buffer chamber and a transfer apparatus.

DETAILED DESCRIPTION

Figure 1:
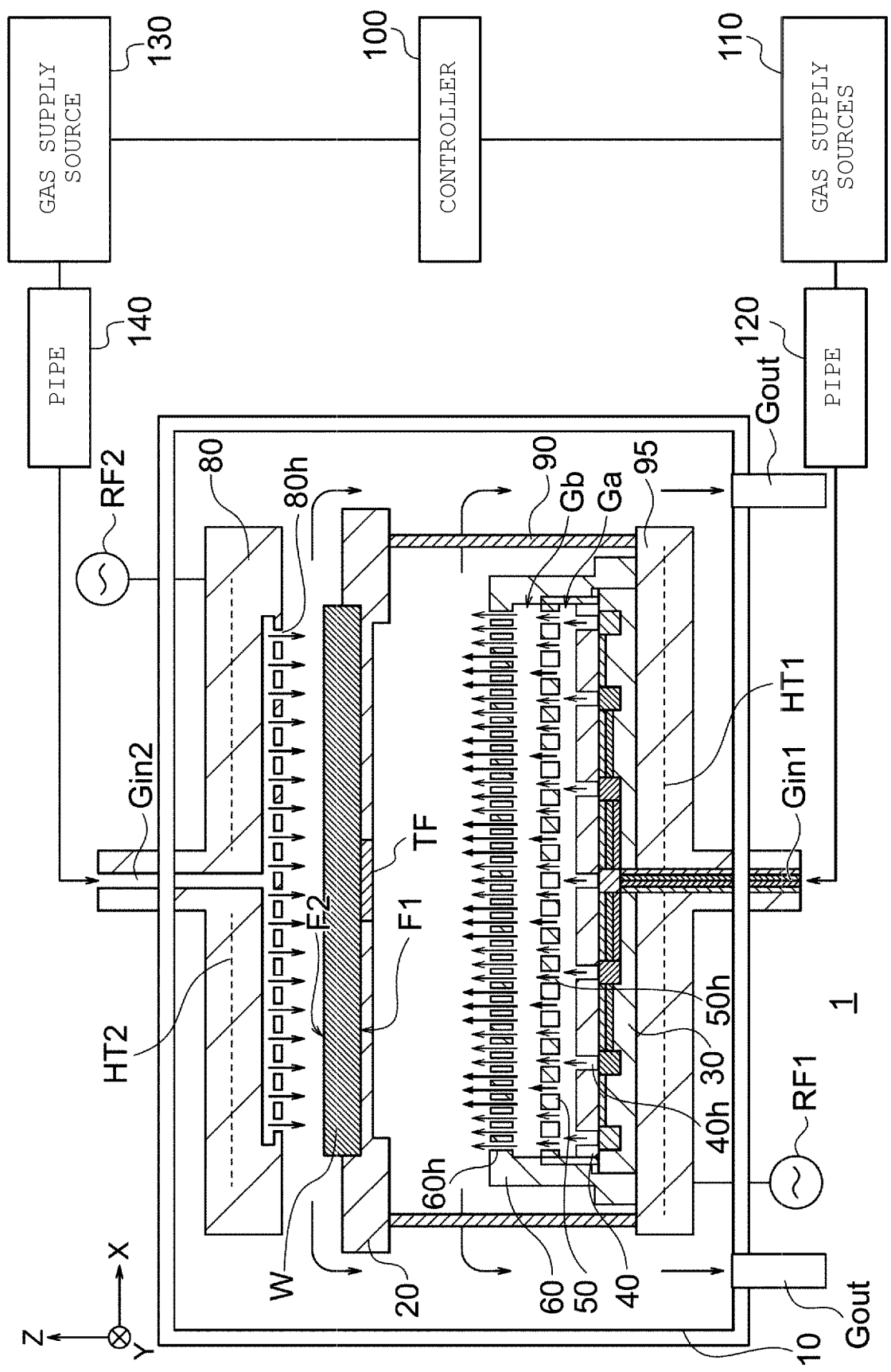
FIG. 1 is a schematic diagram illustrating a configuration example of a semiconductor manufacturing apparatus according to a first embodiment.

In general, according to at least one embodiment, a semiconductor manufacturing apparatus includes a process container. A holder is disposed in the process container, and is arranged to hold a substrate including a first surface and a second surface on an opposite side to the first surface. The holder includes a mask portion that covers a first area of the first surface and exposes a second area different from the first area. A gas supply is configured to introduce a process gas into the process container. A first electrode is disposed between the holder and the gas supply and the gas supply is configured to supply the process gas to the first surface of the substrate. A second electrode is disposed on the second surface of the substrate and is configured to apply an electric field to the process gas between the first and second electrodes. The mask portion includes a first layer in contact with the first surface of the substrate and a second layer spaced further from the substrate than the first layer, and the first layer is recessed further than the second layer in a direction toward the first area in an edge portion of the mask portion that partitions the first area and the second area.

Hereinafter, embodiments according to the present disclosure is described with reference to the drawings. The present embodiments are not intended to limit the present disclosure. The drawings are schematic or conceptual, and a proportion of each unit or the like is not necessarily the same as that of an actual one. In the specification and drawings, the same elements as those described with respect to the drawings already referred to are designated by the same reference numerals, and detailed description thereof is omitted as appropriate.

First Embodiment

FIG. 1 is a schematic diagram illustrating a configuration example of a semiconductor manufacturing apparatus 1 according to a first embodiment. The semiconductor manufacturing apparatus 1 (hereinafter, also simply referred to as the apparatus 1) is, for example, a chemical vapor deposition (CVD) device that forms a material film TF on a substrate W.

The apparatus 1 includes a chamber 10, a carrier ring 20, a gas introduction unit (gas supply) 30, a first gas dispersion plate 40, a second gas dispersion plate 50, a lower electrode 60, an upper electrode 80, a support column 90, a controller 100, gas supply sources 110 and 130, and pipes 120 and 140.

The chamber 10 can accommodate the substrate W and can reduce the pressure in the chamber 10. A film forming process is performed on the substrate W in the chamber 10. For example, a heat-resistant, pressure-resistant, and corrosion-resistant material such as stainless steel is used for the chamber 10.

The carrier ring 20 is a holding unit (holder) that can hold the substrate W in the chamber 10. The carrier ring 20 has, for example, an annular shape, and supports an end portion of the substrate W with a counterbore portion provided in the inner circumference thereof. The central portion of the carrier ring 20 is open, and the material film TF can be formed on a first surface (rear surface) F1 of the substrate W. For example, a material such as aluminum, stainless steel, or ceramics is used for the carrier ring 20. The substrate W includes the first surface F1 on which the material film TF is formed and a second surface F2 on an opposite side of the first surface F1. The substrate W is, for example, a semiconductor substrate such as a silicon substrate. A semiconductor element such as a three-dimensional memory cell array is formed on the second surface F2 of the substrate W. The first surface F1 of the substrate W is a rear surface of the substrate W, and a semiconductor element is not formed thereon. Detailed configurations of the carrier ring 20 are described below.

The gas introduction unit 30 introduces a process gas branched by the pipe 120 from the first surface F1 side of the substrate W into the chamber 10 via a gas introduction pipe Gin1. The gas introduction unit 30 supplies the process gas to the first gas dispersion plate 40. For example, a heat-resistant and corrosion-resistant material such as stainless steel and ceramics is used for the gas introduction unit 30.

The gas introduction pipe Gin1 guides and supplies process gases branched by the pipe 120 to corresponding areas between the first gas dispersion plate 40 and the lower electrode 60.

The first gas dispersion plate 40 is provided between the substrate W and the gas introduction unit 30 and includes a plurality of holes 40h through which the process gases pass. The holes 40h communicates from the gas introduction pipe Gin1 to a space Ga between the first gas dispersion plate 40 and the second gas dispersion plate 50, and introduces the process gases from the gas introduction pipe Gin1 to the space Ga. In this case, the plurality of holes 40h function to disperse the process gases in the space Ga. For example, a material such as aluminum, stainless steel, and ceramics is used for the first gas dispersion plate 40.

The second gas dispersion plate 50 is provided between the first gas dispersion plate 40 and the lower electrode 60, and includes a plurality of holes 50h through which the process gases pass. The holes 50h function to disperse the process gases from the first gas dispersion plate 40 in a space Gb between the second gas dispersion plate 50 and the lower electrode 60. For example, a material such as aluminum, stainless steel, and ceramics is used for the second gas dispersion plate 50. Further, the second gas dispersion plate 50 may not be necessarily provided, and may be omitted. In this case, the process gases introduced from the first gas dispersion plate 40 to the spaces Ga and Gb do not pass through the second gas dispersion plate 50 and are supplied from the lower electrode 60 to the substrate W.

The lower electrode 60 is provided between the substrate W and the first and second gas dispersion plates 40 and 50, and includes a plurality of holes 60h through which the process gases are supplied to the first surface F1 of the substrate W. The holes 60h are located substantially evenly on the lower electrode 60 in a matrix shape. The holes 60h supply the process gases from the first and second gas dispersion plates 40 and 50 to the first surface F1 of the substrate W in the chamber 10. The distance between the first surface F1 of the substrate W and the lower electrode 60 is relatively narrow, and the process gases are supplied to an area facing the holes 60h in the first surface F1 of the substrate W. Further, the numbers of the holes 40h, 50h, and 60h preferably satisfy the number of the holes 40h<the number of the holes 50h<the number of the holes 60h in order to disperse and introduce the process gases into the chamber 10.

In addition, the lower electrode 60 is connected to a high frequency power supply RF1 and receives electric power from the high frequency power supply RF1. Accordingly, the lower electrode 60 is used for applying an electric field to the process gases between the substrate W and the lower electrode 60, ionizing the process gases, and generating plasma. For example, a material such as aluminum, stainless steel, and ceramics is used for the lower electrode 60.

The upper electrode 80 is provided on the second surface F2 side opposite to the first surface F1 of the substrate W. The upper electrode 80 is connected to a high frequency power supply RF2 and receives electric power from the high frequency power supply RF2. The lower electrode 60 and the upper electrode 80 apply electric fields to the process gases between the substrate W and the lower electrode 60 and ionize the process gases to be in a plasma state. Accordingly, the material film TF using the process gas as a raw material is formed on the first surface F1 of the substrate W.

In addition, a gas introduction pipe Gin2 and a plurality of holes 80h are provided on the upper electrode 80. The gas introduction pipe Gin2 introduces inert gases branched by the pipe 140 into the chamber 10. The plurality of holes 80h are provided in the surface of the upper electrode 80 facing the second surface F2 of the substrate W and supply the inert gases to the second surface F2 of the substrate W. During the process, the upper electrode 80 supplies the inert gases from the holes 80h to the second surface F2 of the substrate W and prevents the material film made from the process gases from being formed on the second surface F2 of the substrate W. The inert gas may be, for example, helium, nitrogen, or argon. For example, a material such as aluminum, stainless steel, or ceramics is used for the upper electrode 80.

A heater HT1 is provided under the gas introduction unit 30 and the first and second gas dispersion plates 40 and 50. For example, the heater HT1 is provided in a base 95 that the gas introduction pipe Gin1 penetrates. In addition, a heater HT2 is provided in the upper electrode 80. The heaters HT1 and HT2 heat the substrate W to a predetermined temperature.

The support column 90 is provided between the base 95 and the carrier ring 20 and supports the carrier ring 20.

The controller 100 controls the gas supply sources 110 and 130 and controls the flow rates and introduction time of the process gases and the inert gases. For example, the controller 100 controls the flow rates or the introduction time of the process gases introduced into the spaces Ga and Gb. Accordingly, the thickness of the material film TF formed on the first surface F1 of the substrate W can be changed. That is, the controller 100 can control the film thickness of the material film TF by changing the supply amount of the process gases introduced into the spaces Ga and Gb.

The gas supply sources 110 supply the process gases to the gas introduction pipe Gin1 via the pipe 120. The gas supply source 130 supplies the inert gases to the gas introduction pipe Gin2 via the pipe 140.

The pipe 120 may be, for example, a manifold that is capable of transferring the process gases to the gas introduction pipe Gin1 at any flow rate. The pipe 140 may be, for example, a manifold that is capable of transferring the inert gas to the gas introduction pipe Gin2 at any flow rate.

The controller 100 can control the gas supply sources 110 and the pipe 120 and control the flow rates and the introduction time of the process gases to the gas introduction pipe Gin1. In addition, the controller 100 can control the gas supply source 130 and the pipe 140 and control the flow rates and the introduction time of the inert gases to the gas introduction pipe Gin2.

The process gases and the inert gases introduced into the chamber 10 are used for forming the material film TF and then exhausted from a gas exhaust port Gout.

Carrier Ring 20_1

Figure 2:
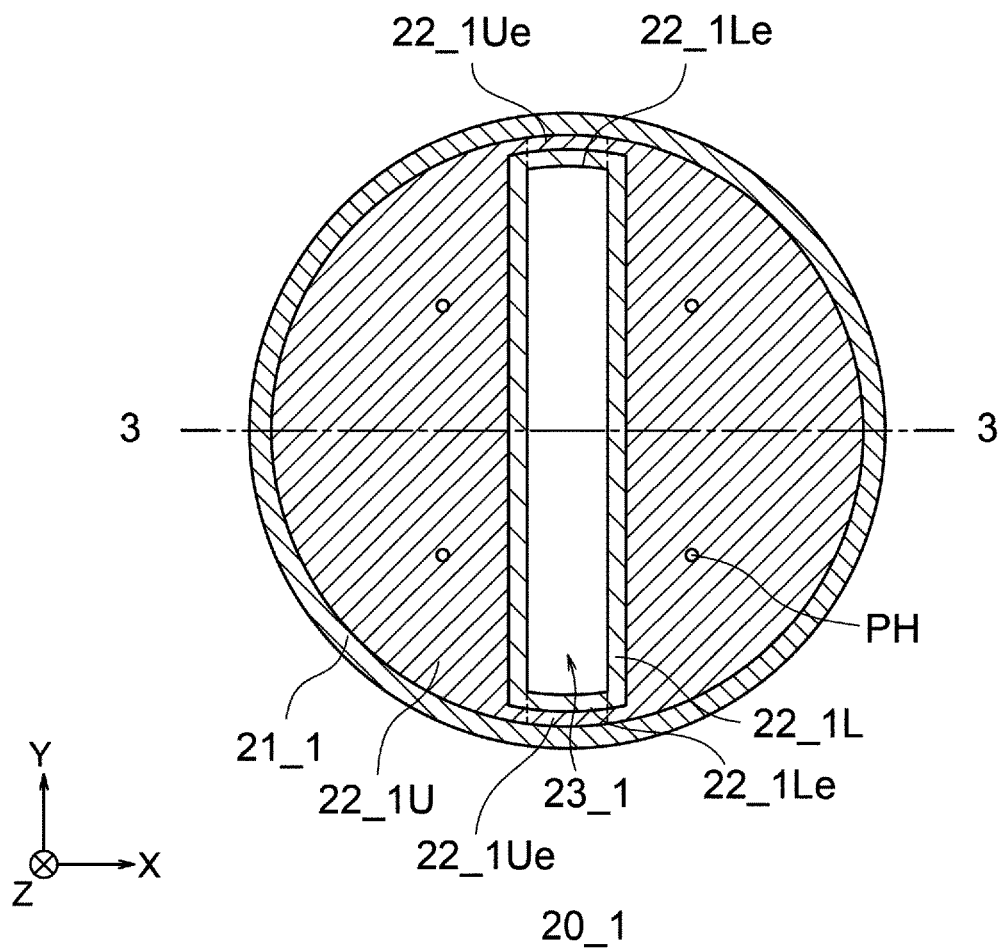
FIG. 2 is a plan view illustrating a configuration example of a carrier ring.
Figure 3:
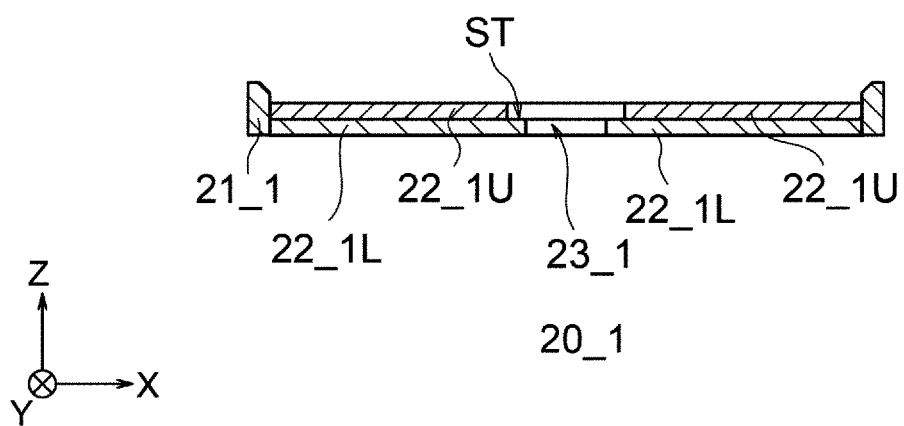
FIG. 3 is a cross-sectional view illustrating a configuration example of the carrier ring.

FIG. 2 is a plan view illustrating a configuration example of a carrier ring 20_1. FIG. 3 is a cross-sectional view illustrating a configuration example of the carrier ring 20_1. FIG. 3 illustrates a cross section taken along the line 3-3 of FIG. 2.

The carrier ring 20_1 as one of the carrier rings 20 has a substantially circular shape having a diameter equal to or larger than the diameter of the substrate W when viewed from a direction (a Z direction) perpendicular to the first surface F1 of the substrate W. Therefore, if the substrate W is mounted on the carrier ring 20_1, when viewed from the Z direction, the carrier ring 20_1 is overlapped with the substrate W, and the outer edge of the lower electrode 60 is positioned outer side than the outer edge of the substrate W.

The carrier ring 20_1 includes an outer edge portion 21_1 and mask portions 22_1U and 22_1L. The outer edge portion 21_1 is provided at the outer edges of the mask portions 22_1U and 22_1L, surrounds the outer peripheries of the mask portions 22_1U and 22_1L, is thicker than the total thickness of the mask portions 22_1U and 22_1L, and protrudes toward the substrate W mounted on the carrier ring 20_1.

The mask portion 22_1U as the first layer is a counterbore portion on which the substrate W is mounted and is brought into contact with the first surface F1 (rear surface) of the substrate W to mask the first surface F1. The mask portion 22_1U has a diameter substantially equal to or slightly larger than the diameter of the substrate W. Accordingly, the substrate W is received into the outer edge portion 21_1 and mounted on the mask portion 22_1U. The outer edge of the substrate W is positioned near the step portion between the outer edge portion 21_1 and the mask portion 22_1U.

The mask portion 22_1L as the second layer is counterbore portion provided lower than the mask portion 22_1U. The mask portion 22_1L is not in direct contact with the first surface F1 (rear surface) of the substrate W, but masks the first surface F1. The mask portion 22_1L is spaced further from the substrate W than the mask portion 22_1U. The mask portion 22_1L has a diameter substantially equal to or slightly larger than the diameter of the substrate W. Accordingly, the substrate W is received into the outer edge portion 21_1 and is mounted above the mask portion 22_1L.

An opening 23_1 is provided in the central portions of the mask portions 22_1U and 22_1L. The opening 23_1 substantially linearly extends in the Y direction substantially parallel to the first surface F1 of the substrate W. The mask portions 22_1U and 22_1L covers the both sides of the first surface F1 of the substrate W in the X direction, and the opening 23_1 exposes the central portion of the first surface F1 of the substrate W.

Between a first area of the first surface F1 of the substrate W, which is covered with the mask portions 22_1L and 22_1U and a second area of the first surface F1 of the substrate W, which is exposed by the opening 23_1 (edge portions of the mask portions 22_1L and 22_1U partitioning the first area and the second area), the mask portion 22_1L protrudes further than the mask portion 22_1U in the ±X direction and the ±Y direction. That is, around the opening 23_1, the mask portion 22_1L protrudes further than the mask portion 22_1U in the extending direction of the opening 23_1 (the ±Y direction) and also in a direction substantially perpendicular to the extending direction of the opening 23_1 (the ±X direction). Accordingly, as illustrated in FIG. 3, in the edge portions of the mask portions 22_1U and 22_1L around the opening 23_1, the mask portion 22_1U and the mask portion 22_1L are formed in a step shape and have a step portion ST. In the step portion ST, the mask portion 22_1U is recessed further than the mask portion 22_1L in the ±Y direction and the ±X direction.

In addition, end portions 22_1Le and 22_1Ue of the mask portions 22_1L and 22_1U are provided in an inner edge portion of the outer edge portion 21_1 at the both end portions of the opening 23_1 in the Y direction. The end portion 22_1Le protrudes further than the end portion 22_1Ue to the opening 23_1 side. That is, the step portion ST is provided in the entire outer periphery of the opening 23_1.

For example, a material such as aluminum, stainless steel, and ceramics is used for the carrier ring 20_1. The mask portions 22_1L and 22_1U may be independently formed and stacked or may be integrally formed. In addition, the mask portions 22_1L and 22_1U and the outer edge portion 21_1 may be independently formed or may be integrally formed.

As illustrated in FIG. 1, the apparatus 1 supplies the process gas from the lower electrode 60 to the carrier ring 20 on the first surface F1 side of the substrate W. If the carrier ring 20_1 is used as the carrier ring 20, the first surface F1 of the substrate W is covered with the mask portions 22_1L and 22_1U of the carrier ring 20_1 and exposed from the opening 23_1. Accordingly, the material film TF is formed in the central portion exposed from the opening 23_1 in the first surface F1 of the substrate W. The material film TF is not formed in the areas covered with the mask portions 22_1L and 22_1U on the first surface F1 of the substrate W. Accordingly, if the material film TF is formed by using the carrier ring 20_1 illustrated in FIGS. 2 and 3, the material film TF is formed in the central portion of the first surface F1 of the substrate W corresponding to the opening 23_1.

Pinholes PH through which lift pins of the apparatus 1 pass are provided in the mask portions 22_1L and 22_1U. Though not illustrated, the lift pins are pins that pass through the pinholes PH to lift the substrate W when the substrate W is mounted on the carrier ring 20 or transferred from the carrier ring 20. By the lift pins passing through the pinholes PH, the substrate W on the carrier ring 20 can be pushed up and raised from the first surface F1 side.

Carrier Ring 20_2

Figure 4:
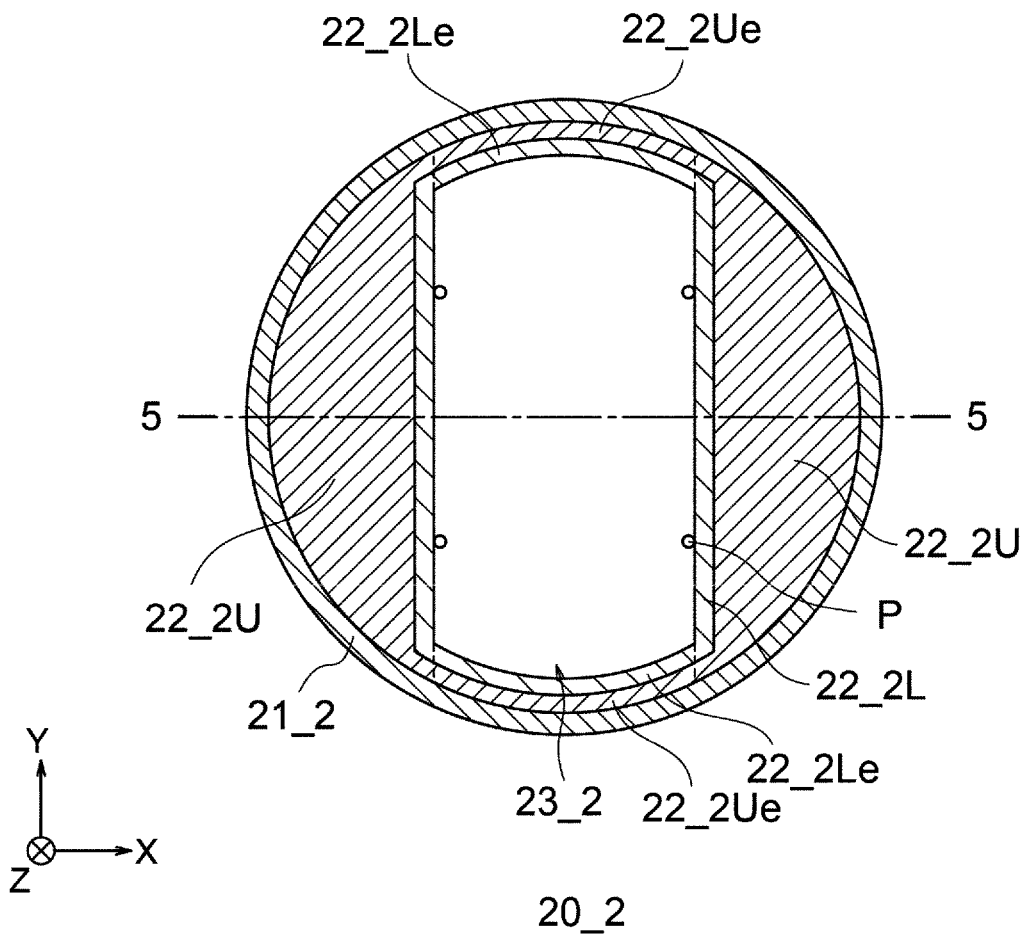
FIG. 4 is a plan view illustrating a configuration example of a carrier ring.
Figure 5:
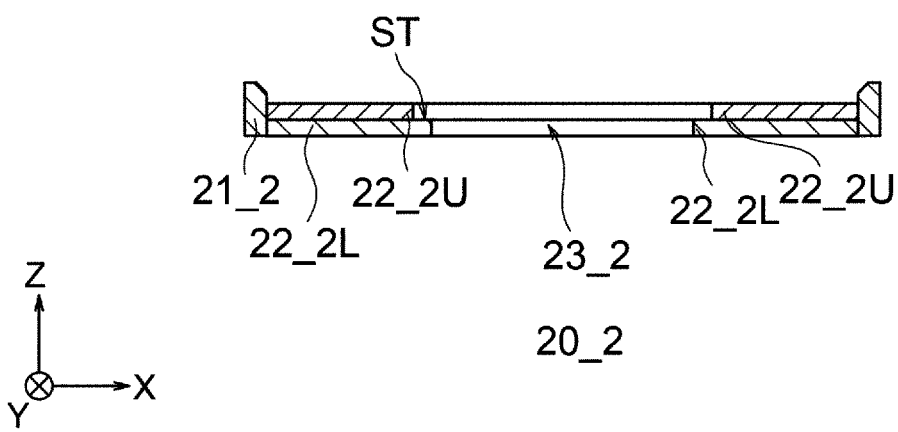
FIG. 5 is a cross-sectional view illustrating a configuration example of the carrier ring.

FIG. 4 is a plan view illustrating a configuration example of a carrier ring 20_2. FIG. 5 is a cross-sectional view illustrating a configuration example of the carrier ring 20_2. FIG. 5 illustrates a cross section taken along the line 5-5 of FIG. 4.

When viewed in the Z direction, the carrier ring 20_2 as one of the carrier rings 20 has a substantially circular shape having a diameter equal to or larger than the diameter of the substrate W. Accordingly, if the substrate W is mounted on the carrier ring 20_2, when viewed from the Z direction, the carrier ring 20_2 is overlapped with the substrate W, and the outer edge of the lower electrode 60 is positioned outside of the outer edge of the substrate W.

The carrier ring 20_2 includes an outer edge portion 21_2 and mask portions 22_2U and 22_2L. The outer edge portion 21_2 and the mask portions 22_2U and 22_2L correspond to the outer edge portion 21_1, the mask portions 22_1U and 22_1L of the carrier ring 20_1, respectively. The configuration of the carrier ring 20_2 may be basically the same as the configuration of the carrier ring 20_1. However, the size of the opening 23_2 of the carrier ring 20_2 is different from the size of the opening 23_1 of the carrier ring 20_1.

The opening 23_2 exposes the central portion of the first surface F1 of the substrate W more widely than the opening 23_1. Between the first area of the first surface F1 of the substrate W, which is covered with the mask portions 22_2L and 22_2U and the second area of the first surface F1 of the substrate W, which is exposed by the opening 23_2 (edge portions of the mask portions 22_2L and 22_2U partitioning the first area and second area), the mask portion 22_2L protrudes further than the mask portion 22_2U in the ±X direction and the ±Y direction. That is, around the opening 23_2, the mask portion 22_2L protrudes further than the mask portion 22_2U in the extending direction of the opening 23_2 (the ±Y direction) and also in a direction substantially perpendicular to the extending direction of the opening 23_2 (the ±X direction). Accordingly, as illustrated in FIG. 5, in the edge portions of the mask portions 22_2U and 22_2L around the opening 23_2, the mask portion 22_2U and the mask portion 22_2L have the step portion ST. That is, in the step portion ST, the mask portion 22_2U is recessed further than the mask portion 22_2L in the ±Y direction and the ±X direction.

Lift pins P pass through the opening 23_2 and raise the substrate W. Accordingly, the pinholes PH are not provided in the mask portions 22_2L and 22_2U. The rest of the configurations of the carrier ring 20_2 may be the same as the configurations of the carrier ring 20_1.

If the carrier ring 20_2 is used as the carrier ring 20, the first surface F1 of the substrate W is covered with the mask portions 22_2L and 22_2U of the carrier ring 20_2, and exposed from the opening 23_2. Accordingly, the material film TF is formed in the central portion exposed from the opening 23_2 on the first surface F1 of the substrate W. In the areas covered with the mask portions 22_2L and 22_2U on the first surface F1 of the substrate W, the material film TF is not formed. Accordingly, if the material film TF is formed by using the carrier ring 20_2 illustrated in FIGS. 4 and 5, the material film TF is formed in the central portion of the first surface F1 of the substrate W corresponding to the opening 23_2.

Carrier Ring 20_3

Figure 6:
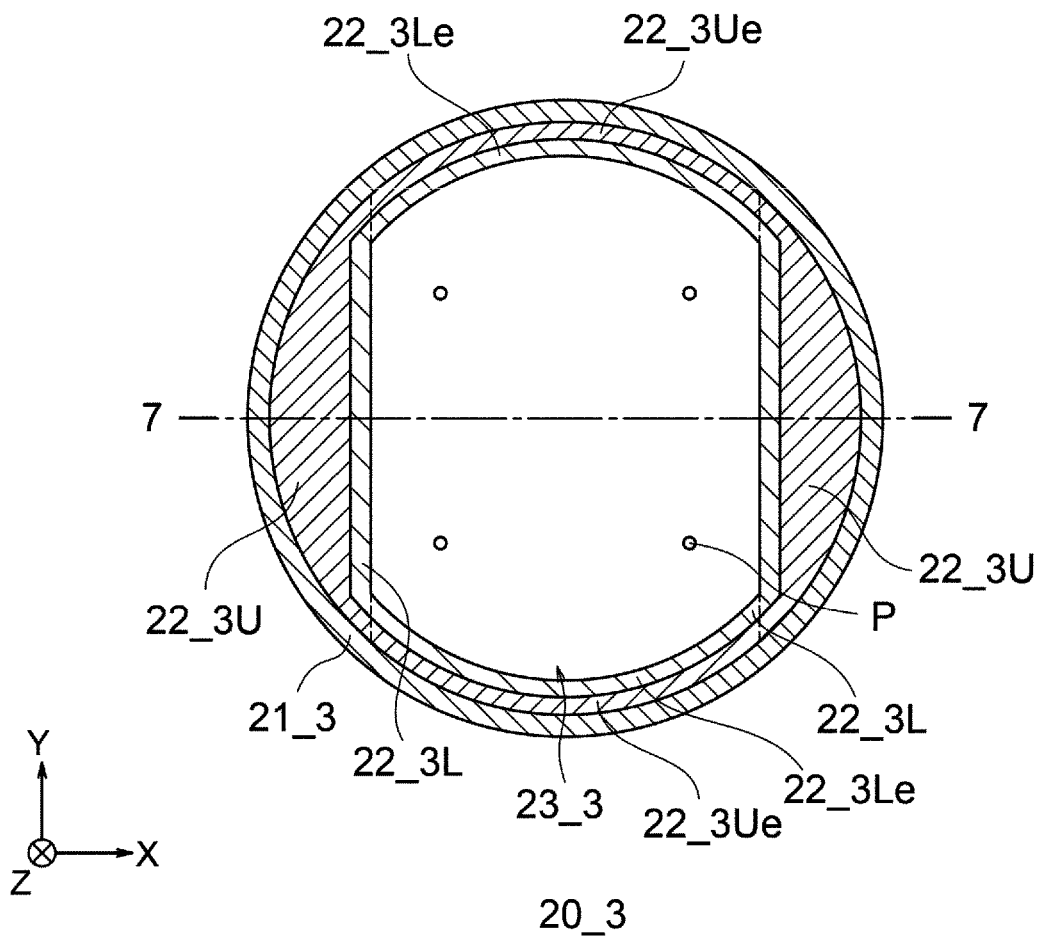
FIG. 6 is a plan view illustrating a configuration example of a carrier ring.
Figure 7:
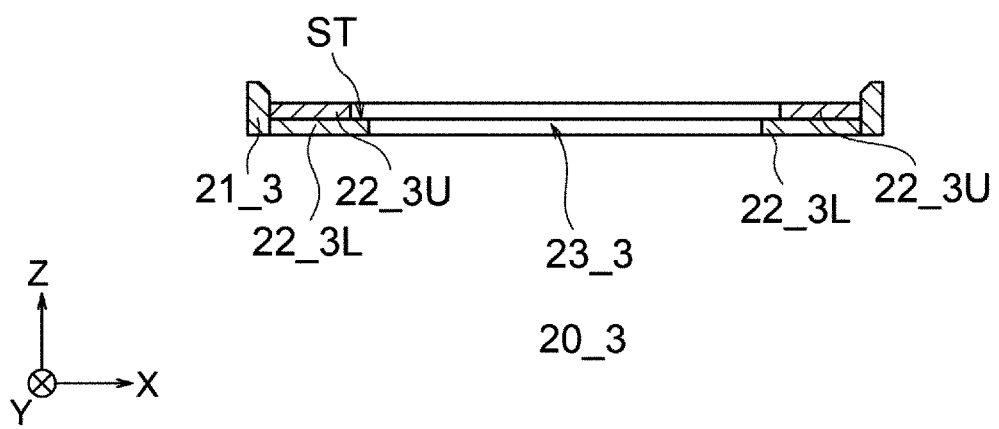
FIG. 7 is a cross-sectional view illustrating a configuration example of the carrier ring.

FIG. 6 is a plan view illustrating a configuration example of a carrier ring 20_3. FIG. 7 is a cross-sectional view illustrating a configuration example of the carrier ring 20_3. FIG. 7 illustrates a cross section taken along the line 7-7 of FIG. 6.

When viewed in the Z direction, the carrier ring 20_3 as one of the carrier rings 20 has a substantially circular shape having a diameter equal to or larger than the diameter of the substrate W. Accordingly, when viewed from the Z direction, if the substrate W is mounted on the carrier ring 20_3, the carrier ring 20_3 is overlapped with the substrate W, and the outer edge of the lower electrode 60 is positioned outside of the outer edge of the substrate W.

The carrier ring 20_3 includes an outer edge portion 21_3 and mask portions 22_3U and 22_3L. The outer edge portion 21_3 and the mask portions 22_3U and 22_3L correspond to the outer edge portion 21_1 (or 21_2), and the mask portions 22_1U and 22_1L (or 22_2U and 22_2L) of the carrier ring 20_1 (or 20_2), respectively. The configuration of the carrier ring 20_3 may be basically the same as that of the carrier ring 20_1 (or 20_2). However, the size of an opening 23_3 of the carrier ring 20_3 is different from that of the opening 23_1 (or 23_2) of the carrier ring 20_1 (or 20_2).

The opening 23_3 exposes the central portion of the first surface F1 of the substrate W more widely than the openings 23_1 and 23_2. Between the first area of the first surface F1 of the substrate W, which is covered with the mask portions 22_3L and 22_3U and the second area of the first surface F1 of the substrate W, which is exposed by the opening 23_3 (edge portions of the mask portions 22_3L and 22_3U that partition the first area and the second area), the mask portion 22_3L protrudes further than the mask portion 22_3U in the ±X direction and the ±Y direction. That is, around of the opening 23_3, the mask portion 22_3L protrudes further than the mask portion 22_3U in the extending direction the opening 23_3 (the ±Y direction) and also in the direction substantially perpendicular to the extending direction of the opening 23_3 (the ±X direction). Accordingly, as illustrated in FIG. 7, in the edge portions of the mask portions 22_3U and 22_3L around the opening 23_3, the mask portion 22_3U and the mask portion 22_3L have the step portion ST. That is, in the step portion ST, the mask portion 22_3U is recessed further than the mask portion 22_3L in the ±Y direction and the ±X direction.

The lift pins P pass through the opening 23_3 and raise the substrate W. Accordingly, the pinholes PH are not provided in the mask portions 22_3L and 22_3U. The rest of the configuration of the carrier ring 20_3 may be the same as the configuration of the carrier ring 20_1 (or 20_2).

If the carrier ring 20_3 is used as the carrier ring 20, the first surface F1 of the substrate W is covered with the mask portions 22_3L and 22_3U of the carrier ring 20_3 and exposed from the opening 23_3. Accordingly, the material film TF is formed in the central portion exposed from the opening 23_3 on the first surface F1 of the substrate W. The material film TF is not formed in the areas covered with the mask portions 22_3L and 22_3U on the first surface F1 of the substrate W. Accordingly, if the material film TF is formed by using the carrier ring 20_3 illustrated in FIGS. 6 and 7, the material film TF is formed in the central portion of the first surface F1 of the substrate W corresponding to the opening 23_3.

Carrier Ring 20_4

Figure 8:
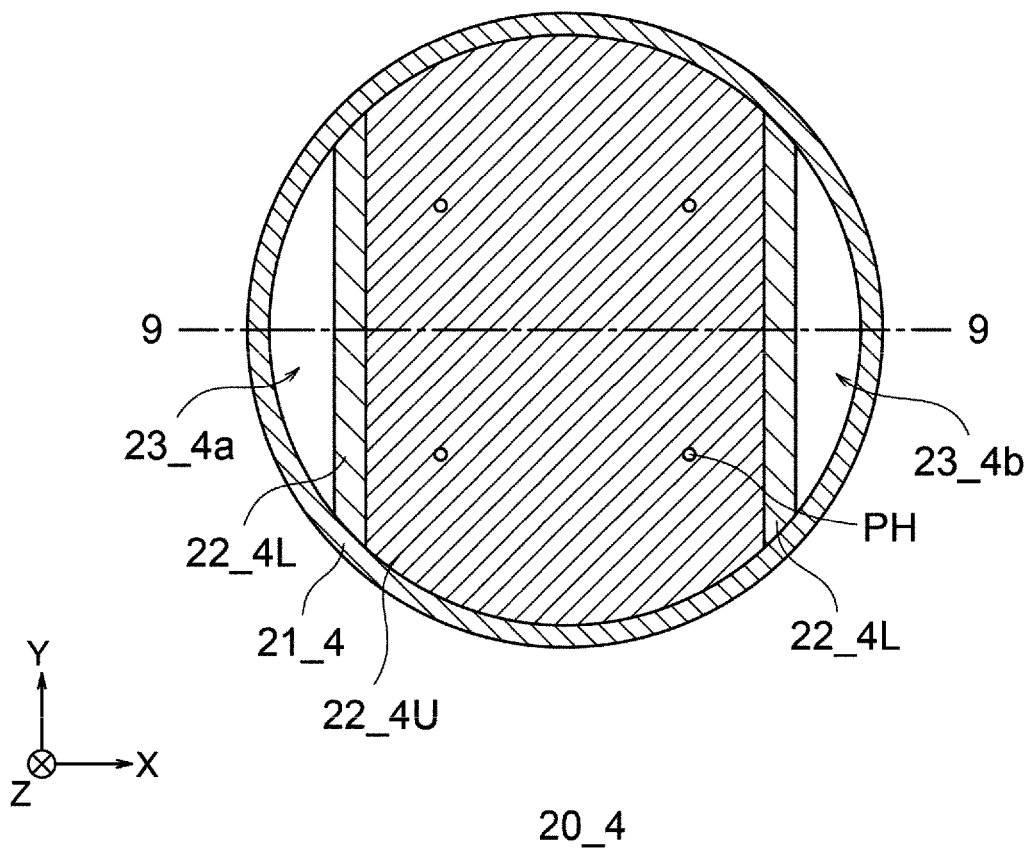
FIG. 8 is a plan view illustrating a configuration example of a carrier ring.
Figure 9:
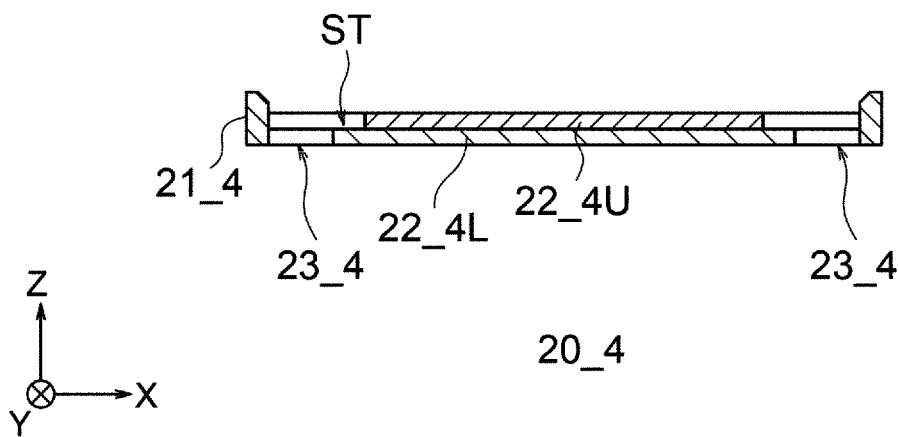
FIG. 9 is a cross-sectional view illustrating a configuration example of the carrier ring.

FIG. 8 is a plan view illustrating a configuration example of a carrier ring 20_4. FIG. 9 is a cross-sectional view illustrating a configuration example of the carrier ring 20_4. FIG. 9 is a cross section taken along the line 9-9 of FIG. 8.

When viewed in the direction perpendicular to the first surface F1 of the substrate W (the Z direction), the carrier ring 20_4 as one of the carrier rings 20 has a substantially circular shape having a diameter equal to or larger than the diameter of the substrate W. Accordingly, when viewed from the Z direction, if the substrate W is mounted on the carrier ring 20_4, the carrier ring 20_4 is overlapped with the substrate W, and the outer edge of the lower electrode 60 is positioned outside of the outer edge of the substrate W.

The carrier ring 20_4 includes an outer edge portion 21_4 and mask portions 22_4U and 22_4L. The outer edge portion 21_4 is provided on the outer edges of the mask portions 22_4U and 22_4L and is thicker than the mask portions 22_4U and 22_4L.

The mask portion 22_4U is a counterbore portion on which the substrate W is mounted, and is brought into contact with the first surface F1 (rear surface) of the substrate W to mask the first surface F1. The mask portion 22_4U has a diameter substantially equal to or slightly larger than the diameter of the substrate W except for the both ends in the X direction. Accordingly, the substrate W is received into the outer edge portion 21_4 and mounted in the mask portion 22_4U. The outer edge of the substrate W is positioned near the step portion between the outer edge portion 21_4 and the mask portion 22_4U.

The mask portion 22_4L is a counterbore portion provided under the mask portion 22_4U and is not in direct contact with the first surface F1 (rear surface) of the substrate W, but masks the first surface F1. The mask portion 22_4L has a diameter substantially equal to or slightly larger than the diameter of the substrate W except for the both ends in the X direction. Accordingly, the substrate W is received into the outer edge portion 21_4 and mounted above the mask portion 22_4L.

Openings 23_4a and 23_4b are provided outside the mask portions 22_4U and 22_4L in the ±X direction. The openings 23_4a and 23_4b extend in the Y direction substantially parallel to the first surface F1 of the substrate W. The mask portions 22_4U and 22_4L cover the central portion of the first surface F1 of the substrate W, and the openings 23_4a and 23_4b expose the both end portions of the substrate W in the ±X direction.

Between the first area of the first surface F1 of the substrate W covered with the mask portions 22_4L and 22_4U and the second area of the first surface F1 of the substrate W exposed by the openings 23_4a and 23_4b, the mask portion 22_4L protrudes further than the mask portion 22_4U in the ±X direction. That is, in the edge portions of the mask portions 22_4L and 22_4U that partition the first area and the second area, the mask portion 22_4L protrudes further than the mask portion 22_4U in the direction substantially perpendicular to the extending direction of the openings 23_4a and 23_4b (the ±X direction). Accordingly, as illustrated in FIG. 9, in the both edge portions of the mask portions 22_4U and 22_4L in the X direction between the openings 23_4a and 23_4b, the mask portion 22_4U and the mask portion 22_4L have the step portion ST. In the step portion ST, the mask portion 22_4U is recessed further than the mask portion 22_4L in the ±X direction.

The pinholes PH through which the lift pins of the apparatus 1 pass are provided in the mask portions 22_4L and 22_4U. The lift pins are pins that pass through the pinholes PH to lift the substrate W when the substrate W is mounted on the carrier ring 20 or transferred from the carrier ring 20. By the lift pins passing through the pinholes PH, the substrate W on the carrier ring 20 can be pushed up and raised from the first surface F1 side. The rest of the configuration of the carrier ring 20_4 may be the same as any configurations of the carrier rings 20_1 to 20_3.

Carrier Ring 20_5

Figure 10:
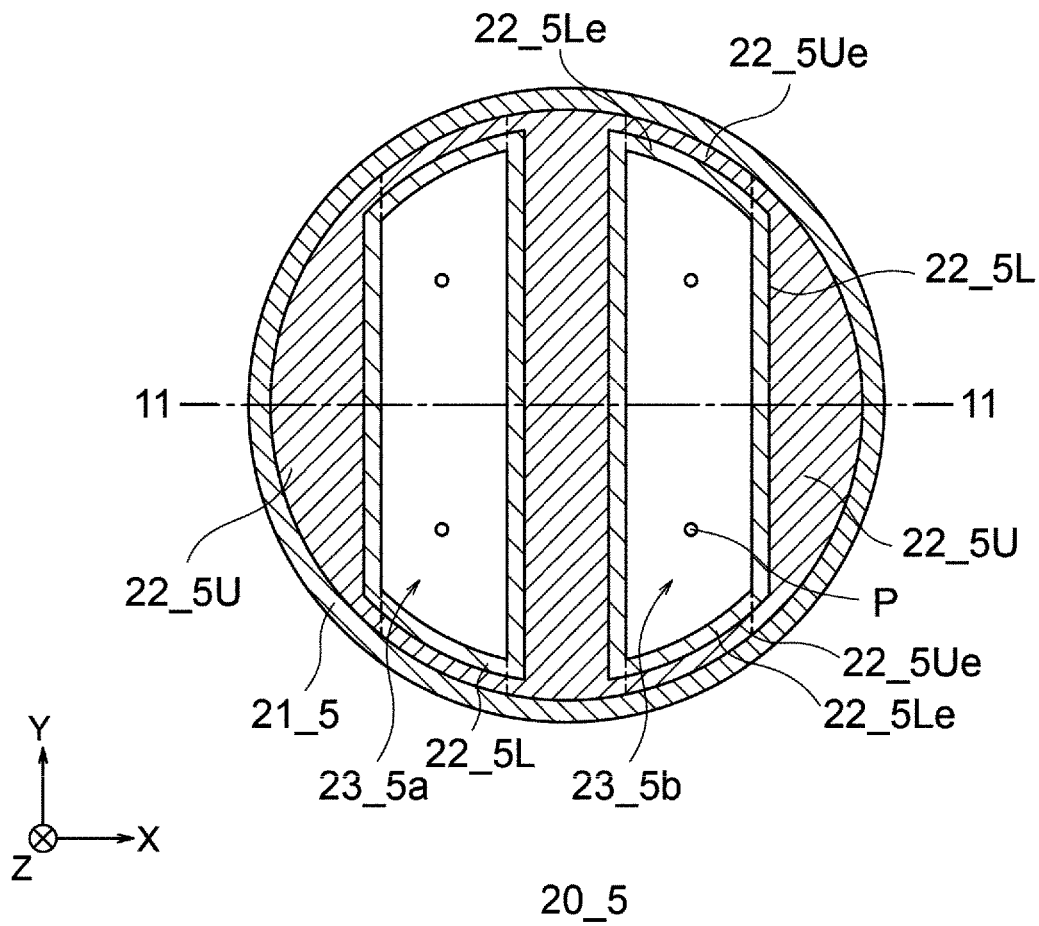
FIG. 10 is a plan view illustrating a configuration example of a carrier ring.
Figure 11:
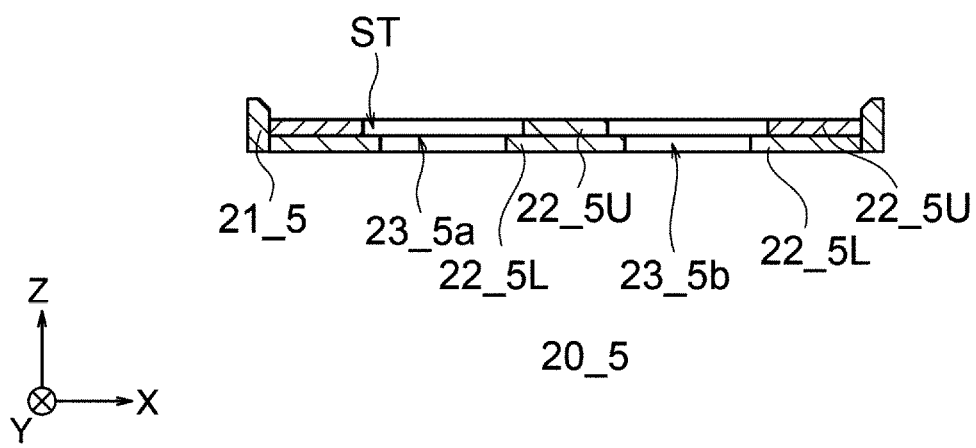
FIG. 11 is a cross-sectional view illustrating a configuration example of the carrier ring.

FIG. 10 is a plan view illustrating a configuration example of a carrier ring 20_5. FIG. 11 is a cross-sectional view illustrating a configuration example of the carrier ring 20_5. FIG. 11 is a cross section taken along the line 11-11 of FIG. 10.

When viewed in a direction perpendicular to the first surface F1 of the substrate W (the Z direction), the carrier ring 20_5 as one of the carrier rings 20 has a substantially circular shape having the diameter equal to or larger than the diameter of the substrate W. Accordingly, when viewed from the Z direction, if the substrate W is mounted on the carrier ring 20_5, the carrier ring 20_5 is overlapped with the substrate W, and the outer edge of the lower electrode 60 is positioned outside of the outer edge of the substrate W.

The carrier ring 20_5 includes an outer edge portion 21_5 and mask portions 22_5U and 22_5L. The outer edge portion 21_5 is provided in the outer edges of the mask portions 22_5U and 22_5L and is thicker than the mask portions 22_5U and 22_5L.

The mask portion 22_5U is a counterbore portion on which the substrate W is mounted and is in contact with the first surface F1 (rear surface) of the substrate W to mask the first surface F1. The mask portion 22_5U has the diameter substantially equal to or slightly larger than the diameter of the substrate W. Accordingly, the substrate W is received into the outer edge portion 21_5 and mounted on the mask portion 22_5U. The outer edge of the substrate W is positioned near the step portion between the outer edge portion 21_5 and the mask portion 22_5U.

The mask portion 22_5L is a counterbore portion provided under the mask portion 22_5U and is not in direct contact with the first surface F1 (rear surface) of the substrate W to mask the first surface F1. The mask portion 22_5L has a diameter that is substantially equal to or slightly larger than the diameter of the substrate W. Accordingly, the substrate W is received into the outer edge portion 21_5 and is mounted over the mask portion 22_5L.

Openings 23_5a and 23_5b are provided in the carrier ring 20_5 except for the central portions of the mask portions 22_5U and 22_5L and the both end portions thereof in the ±X direction. The openings 23_5a and 23_5b extend in the Y direction substantially parallel to the first surface F1 of the substrate W. The mask portions 22_5U and 22_5L cover the central portion of the first surface F1 of the substrate W and the both end portions (first area) thereof in the ±X direction. The openings 23_5a and 23_5b expose the intermediate portions (second area) of the substrate W which are portions other than the central portion and the both end portions in the ±X direction.

Between the first area of the first surface F1 of the substrate W, which is covered with the mask portions 22_5L and 22_5U and the second area of the first surface F1 of the substrate W, which is exposed by the openings 23_5a and 23_5b (edge portions of the mask portions 22_5L and 22_5U that partition the first area and the second area), the mask portion 22_5L protrudes further than the mask portion 22_5U in the ±X direction and the ±Y direction. That is, around the openings 23_5a and 23_5b, the mask portion 22_5L protrudes further than the mask portion 22_5U in the extending direction of the openings 23_5a and 23_5b (the ±Y direction) and also in a direction substantially perpendicular to the extending direction of the openings 23_5a and 23_5b (the ±X direction). Accordingly, as illustrated in FIG. 10, in the edge portions of the mask portions 22_5U and 22_5L around the openings 23_5a and 23_5b, the mask portion 22_5U and the mask portion 22_5L have the step portion ST. In the step portion ST, the mask portion 22_5U is recessed further than the mask portion 22_5L in the ±Y direction and the ±X direction.

The lift pins P pass through the openings 23_5a and 23_5b and raise the substrate W. Accordingly, the pinholes PH are not provided in the mask portions 22_5L and 22_5U. The rest of the configuration of the carrier ring 20_5 may be the same as any configurations of the carrier rings 20_1 to 20_4.

If the carrier ring 20_5 is used as the carrier ring 20, the first surface F1 of the substrate W is covered with the mask portions 22_5L and 22_5U of the carrier ring 20_5 and is exposed from the openings 23_5a and 23_5b. Accordingly, the material film TF is formed in the area exposed from the openings 23_5a and 23_5b on the first surface F1 of the substrate W. The material film TF is not formed in the area covered with the mask portions 22_5L and 22_5U on the first surface F1 of the substrate W. Accordingly, if the material film TF is formed by using the carrier ring 20_5 illustrated in FIGS. 10 and 11, the material film TF is formed on the first surface F1 of the substrate W corresponding to the openings 23_5a and 23_5b.

Subsequently, a method of forming the material film TF on the first surface F1 of the substrate W by using the carrier rings 20_1 to 20_5 is described.

FIGS. 12A to 12D are cross-sectional views illustrating the method of forming the material film TF by using the carrier ring 20_5 as an example.

Figure 12A:
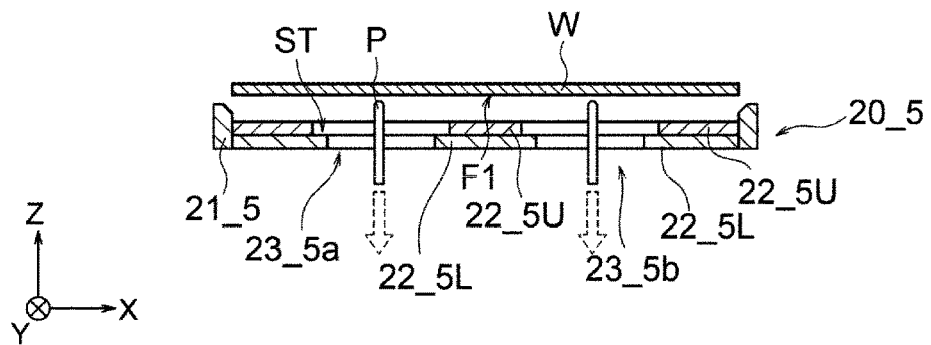
FIG. 12A is a cross-sectional view illustrating a method of forming a material film by using the carrier ring.
Figure 12B:
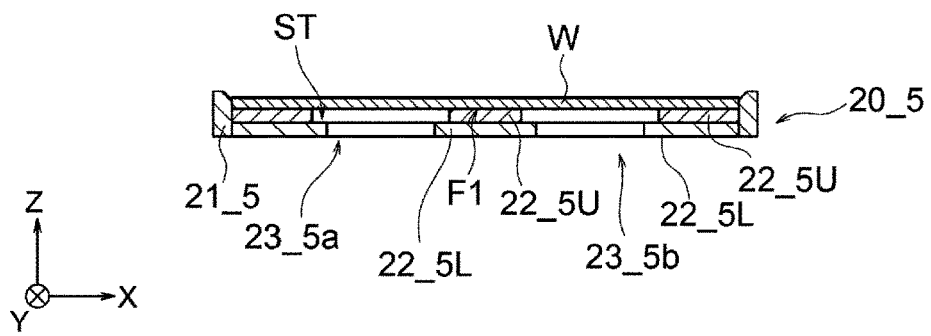
FIG. 12B is a cross-sectional view illustrating a method of forming the material film by using the carrier ring.

In the chamber 10 of the apparatus 1, the substrate W placed on the lift pins P as illustrated in FIG. 12A is placed on the mask portion 22_5U of the carrier ring 20_5 as illustrated in FIG. 12B by lowering the lift pins P.

Figure 12C:
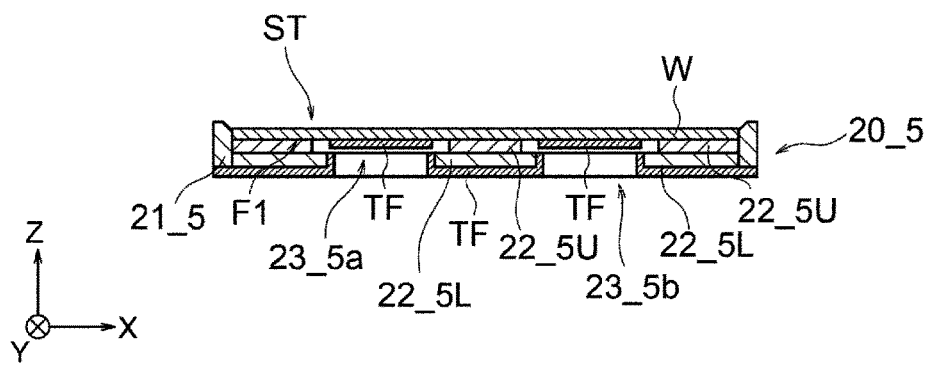
FIG. 12C is a cross-sectional view illustrating a method of forming the material film by using the carrier ring.

Subsequently, by supplying the process gas from the lower electrode 60, the material film TF is formed on the first surface F1 of the substrate W exposed from the openings 23_5a and 23_5b. At this point, the material film TF is deposited on the rear surface of the mask portion 22_5L that faces the lower electrode 60 and the inner walls of the openings 23_5a and 23_5b. On the inner walls of the openings 23_5a and 23_5b, the mask portions 22_5L and 22_5U constitute the step portion ST. In the step portion ST, the mask portion 22_5U is recessed further than the mask portion 22_5L in the ±X direction. In addition, as illustrated in FIG. 12C, the thickness of the mask portion 22_5U is caused to be thin so that the material film TF is rarely formed on the side wall of the mask portion 22_5U.

A distance between the mask portion 22_5L and the substrate W is, for example, 0.2 mm to 1.0 mm. In this case, the process gas ionized by the plasma is not introduced into the gap between the mask portion 22_5L and the substrate W. Accordingly, the material film TF is rarely formed on the side wall of the mask portion 22_5U.

Figure 12D:
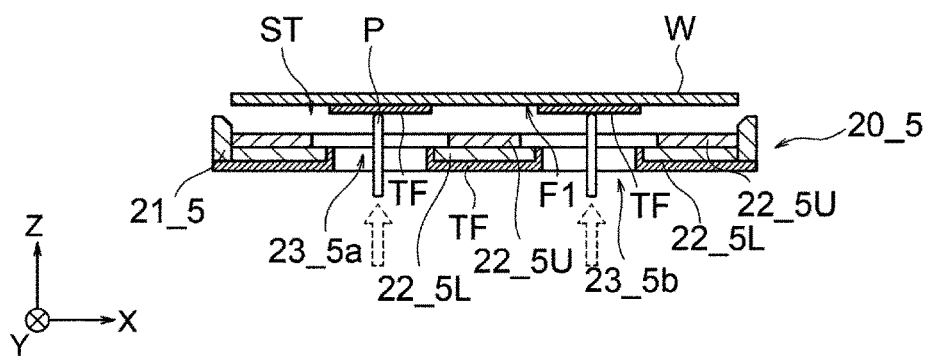
FIG. 12D is a cross-sectional view illustrating a method of forming the material film by using the carrier ring.

As a result, after forming the material film TF, the material film TF formed on the first surface F1 of the substrate W is substantially separated from the material film TF deposited on the mask portion 22_5L. Accordingly, as illustrated in FIG. 12D, when the substrate W is raised by the lift pins P, burrs of the material film TF are not generated on the first surface F1 of the substrate W.

Figure 13A:
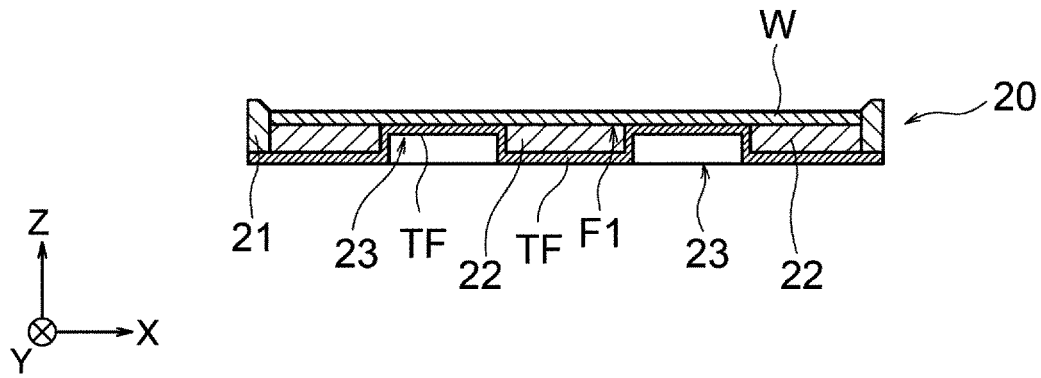
FIG. 13A is a diagram illustrating a comparative example.
Figure 13B:
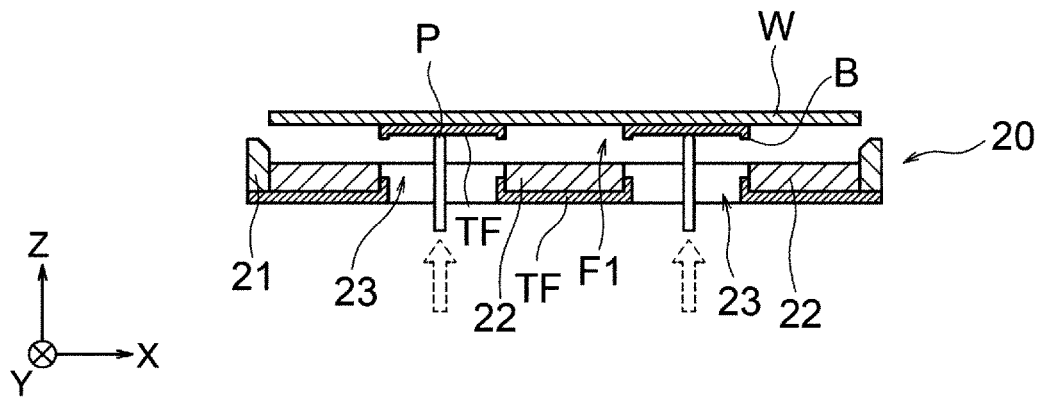
FIG. 13B is a diagram illustrating the comparative example.

FIGS. 13A and 13B are diagrams of comparative examples. In the comparative examples, a mask portion 22 does not include the step portion ST on the inner wall of an opening 23. In this case, as illustrated in FIG. 13A, the material film TF is continuously formed along the rear surface of the mask portion 22, the inner wall of the opening 23, and the first surface F1 of the substrate W.

As illustrated in FIG. 13B, when the substrate W is raised with the lift pins P, the end portion of the material film TF of the first surface F1 of the substrate W is pulled by the material film TF left on the inner wall of the opening 23, to generate burrs. The burrs of the material film TF may cause particles in subsequent steps.

In contrast, since the carrier ring 20_5 according to the present embodiment includes the step portion ST on the inner walls of the openings 23_5a and 23_5b, after the material film TF is formed, the material film TF of the substrate W is substantially separated from the material film TF deposited in the mask portion 22_5L. Accordingly, when the substrate W is raised with the lift pins P, burrs of the material film TF are not generated on the first surface F1 of the substrate W.

Here, the warpage of the substrate W is described.

Figure 14:
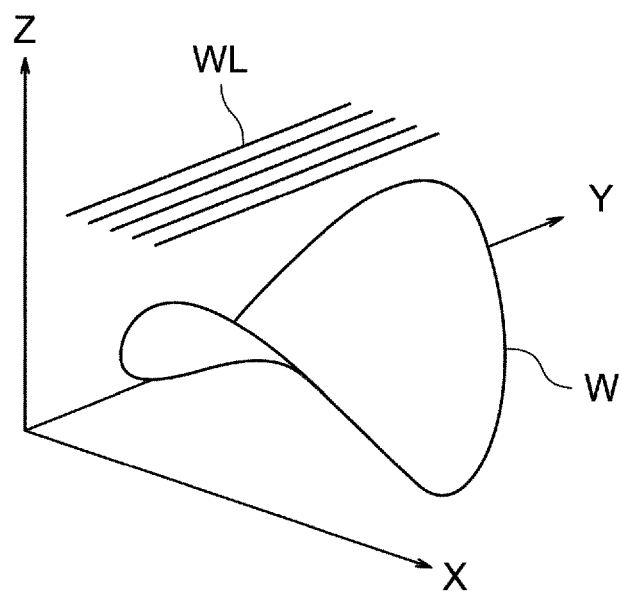
FIG. 14 is a conceptual diagram illustrating a relationship between warpage of a substrate and a word line.

FIG. 14 is a conceptual diagram illustrating the relationship between the warpage of the substrate W and word lines WL. In the three-dimensional memory cell array, the word lines WL are stacked in the Z direction and are electrically separated by slits extending in the Z direction (not illustrated). In the plan view seen from the Z direction, if slits extend in the Y direction, the word lines WL extend in the Y direction as illustrated in FIG. 14.

The warpage of the substrate W depends on the extending direction of the word lines WL. For example, if the extending direction of the word lines WL is the Y direction, as illustrated in FIG. 14, the substrate W is recessed in the −Z direction, in the central portion of the Y direction and rises in the +Z direction in the both end portions. That is, the substrate W is curved in a substantially U-shape (bowl shape) in the cross section in the Y direction. It is concerned that such warpage of the substrate W can hinder the transfer of the substrate W in the semiconductor manufacturing process. In addition, the warpage of the substrate W causes a decrease in the yield. Accordingly, in the present embodiment, the material film TF is formed on the rear surface of the substrate W to correct the warpage of the substrate W by the word lines WL.

Figure 15:
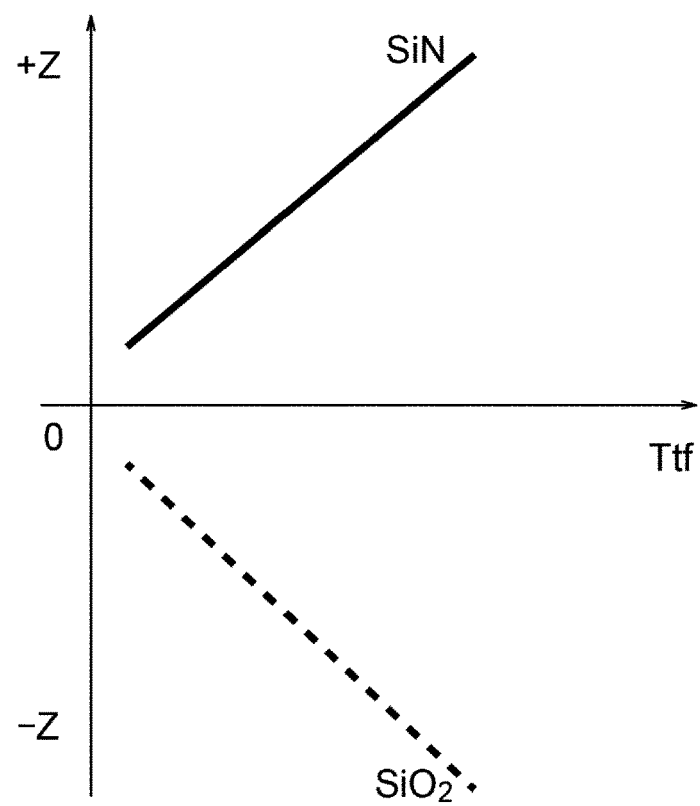
FIG. 15 is a graph showing a warpage amount of the substrate when the material film is formed on a first surface of the substrate.

FIG. 15 is a graph showing the warpage amount of the substrate W when the material film TF is formed on the first surface F1 of the substrate W. The horizontal axis shows a thickness Ttf of the material film TF. The vertical axis shows the warpage amount of the substrate W due to the material film TF. The warpage amount of the substrate W shows the position of the central portion in the Z direction with respect to the end portions of the substrate W. Accordingly, in this graph, regarding the +Z direction, it is meant that the central portion of the substrate W protrudes further than the end portions and is in a mountain-shaped convex state. Regarding the −Z direction, it is meant that the central portion of the substrate W is recessed further than the end portions and is in a bowl-shaped concave state. In addition, FIGS. 16A and 16B are conceptual diagrams illustrating the warpage of the substrate W when the material film TF is formed on the first surface F1 of the substrate W.

Figure 16A:
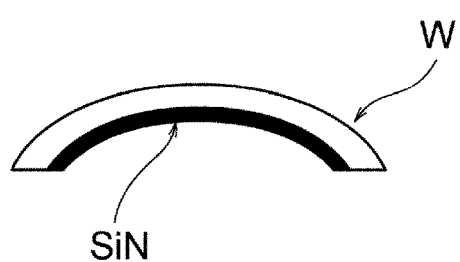
FIG. 16A is a conceptual diagram illustrating the warpage of the substrate when the material film is formed on the first surface of the substrate.

If the material film TF is a silicon nitride film, as illustrated in FIG. 16A, the central portion of the substrate W protrudes further than the end portions, and the substrate W warps in a mountain shape. As illustrated in FIG. 15, if the film thickness Ttf of the material film TF (silicon nitride film) becomes thick, the warpage amount of the substrate W increases.

Figure 16B:
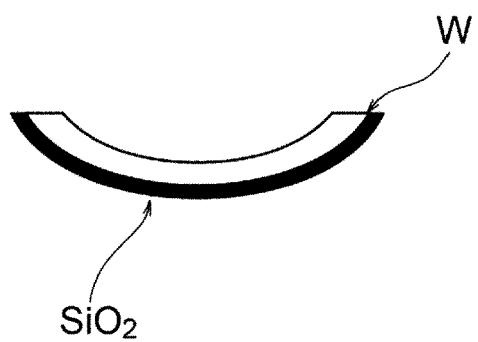
FIG. 16B is a conceptual diagram illustrating the warpage of the substrate when the material film is formed on the first surface of the substrate.
Figure 17:
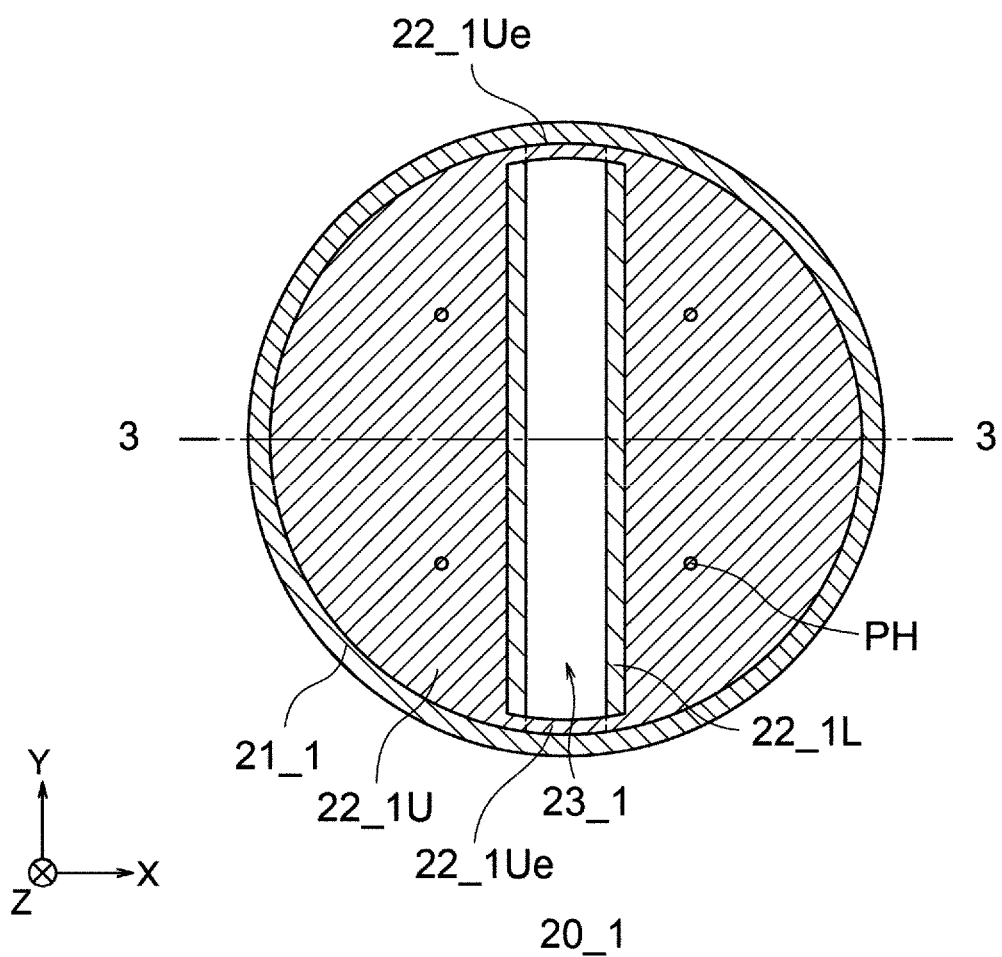
FIG. 17 is a plan view illustrating a configuration example of the carrier ring according to a second embodiment.
Figure 18:
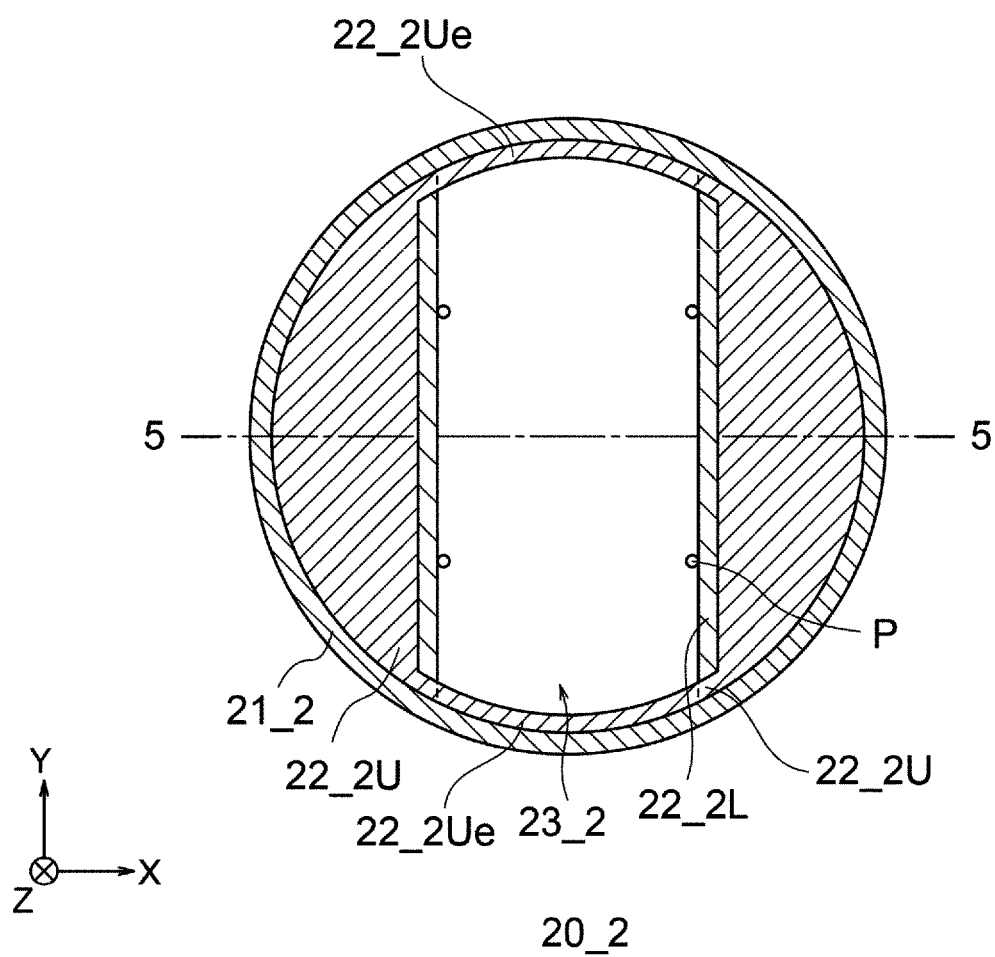
FIG. 18 is a plan view illustrating a configuration example of the carrier ring according to the second embodiment.
Figure 19:
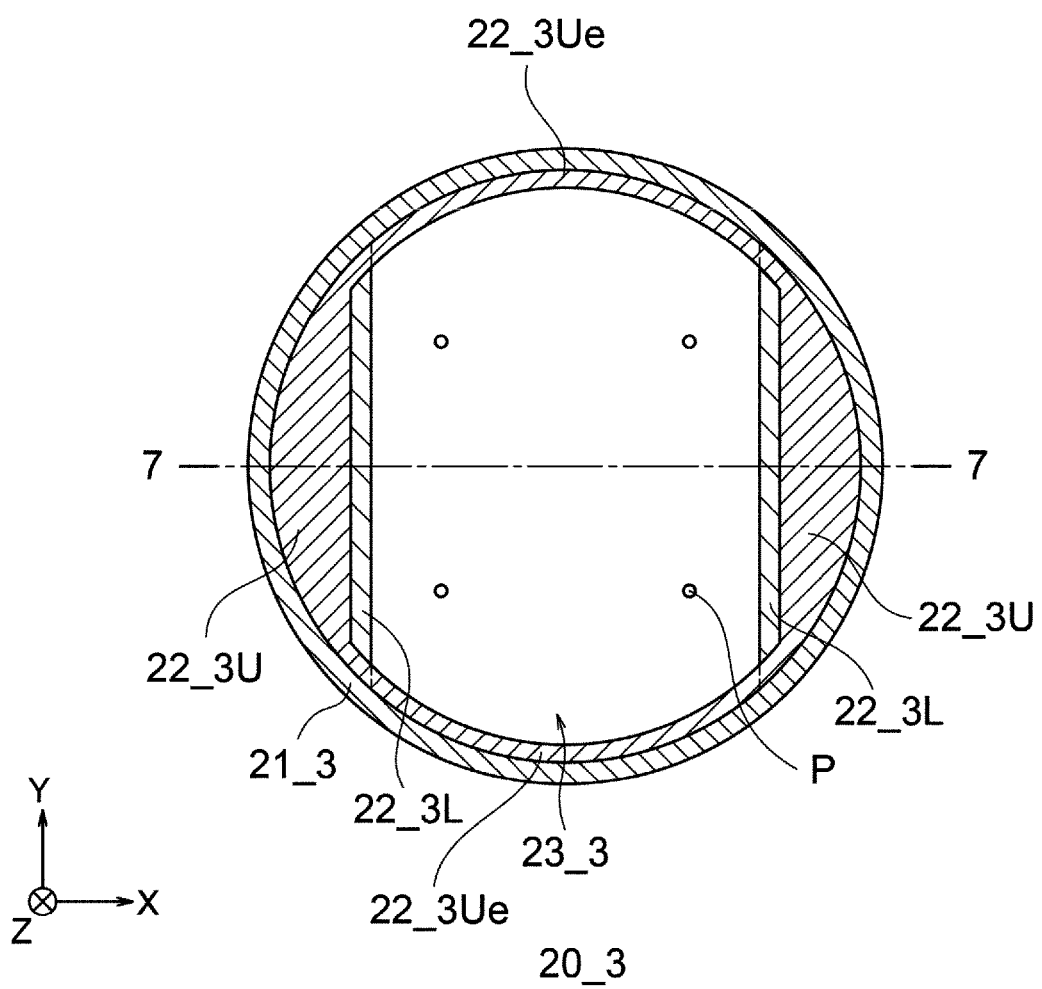
FIG. 19 is a plan view illustrating a configuration example of the carrier ring according to the second embodiment.
Figure 20:
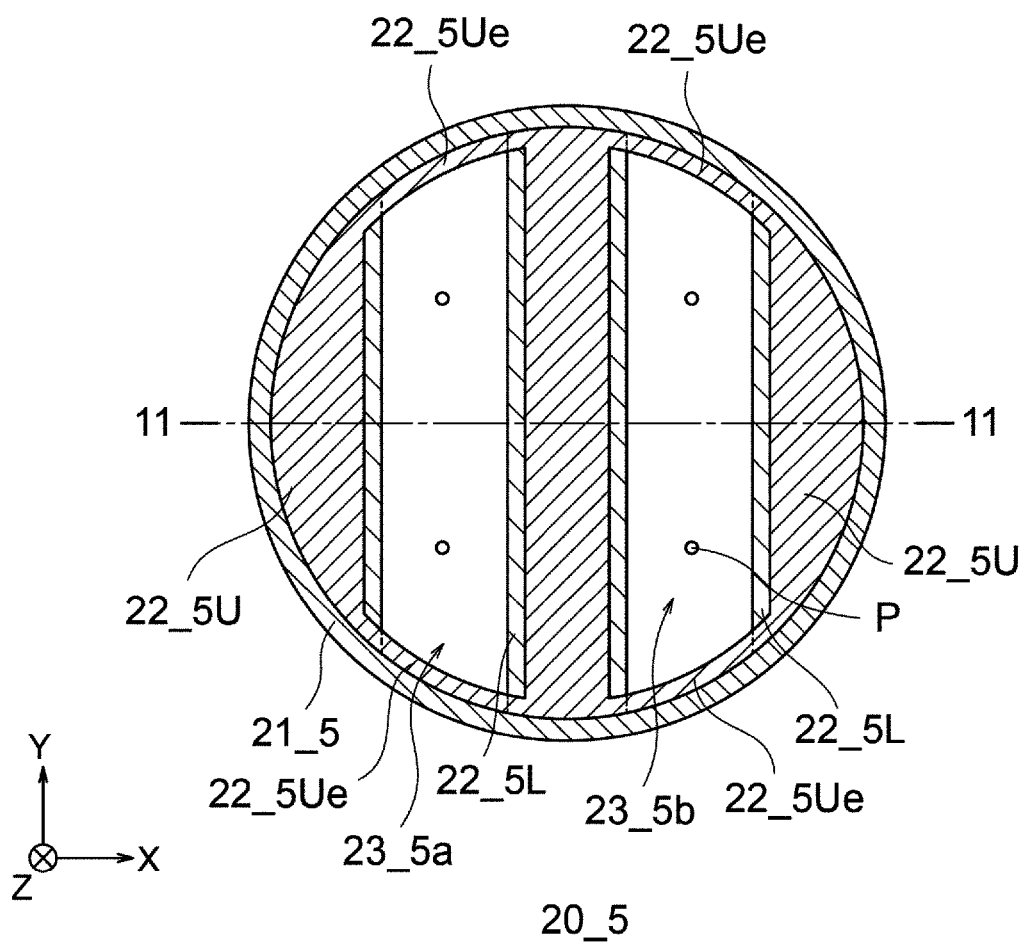
FIG. 20 is a plan view illustrating a configuration example of the carrier ring according to the second embodiment.
Figure 21:
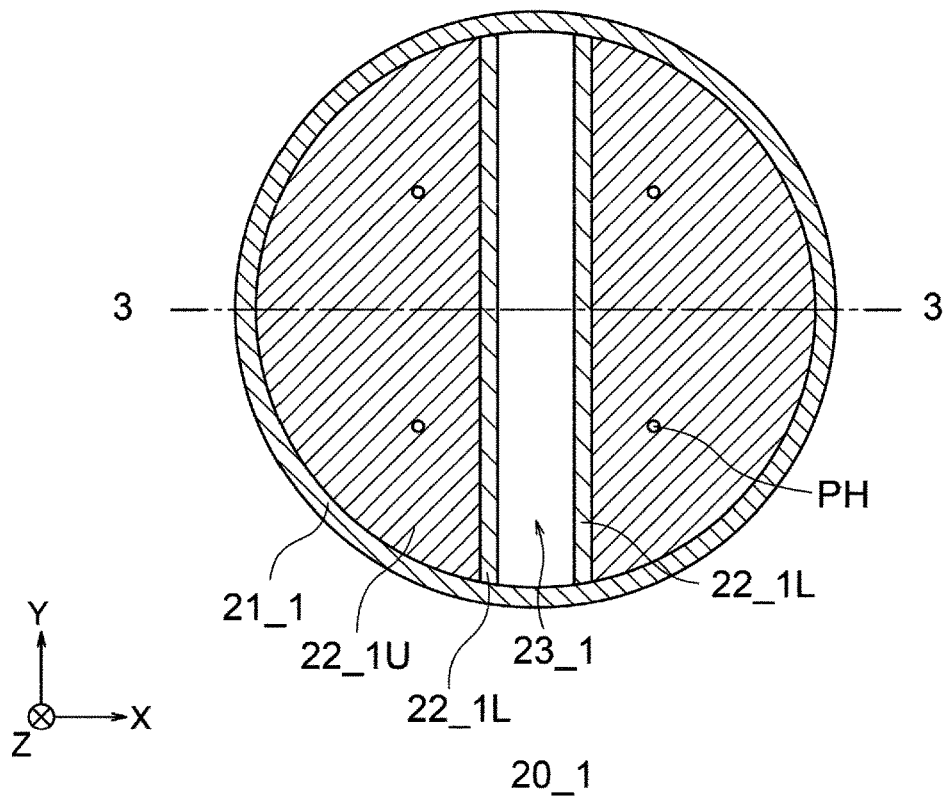
FIG. 21 is a plan view illustrating a configuration example of the carrier ring according to a third embodiment.
Figure 22:
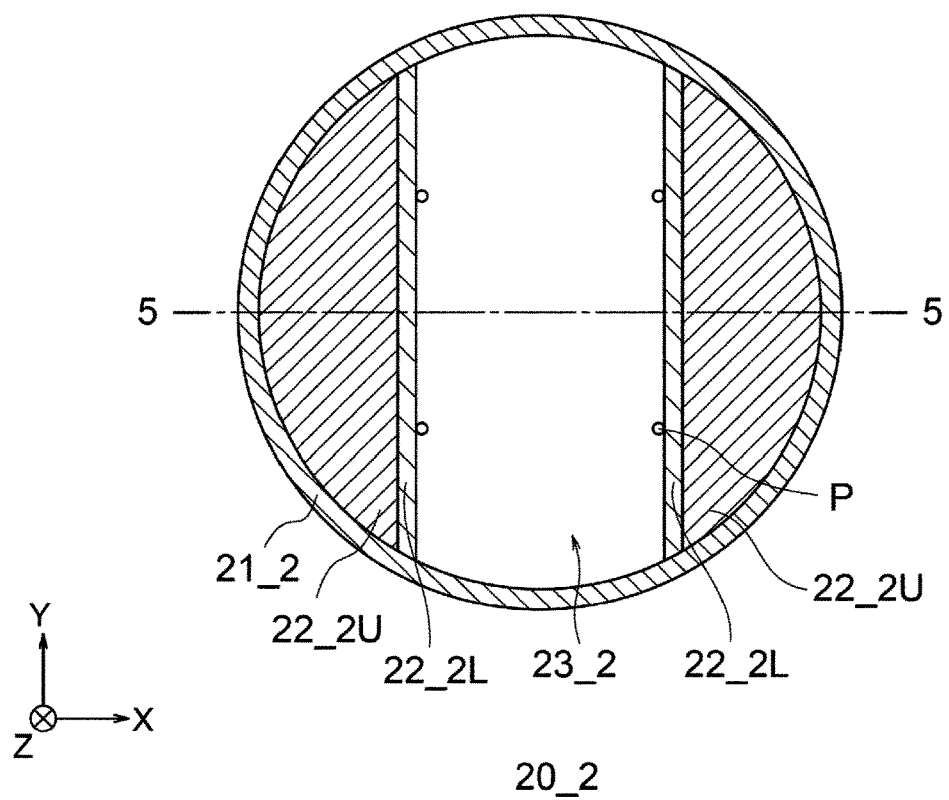
FIG. 22 is a plan view illustrating a configuration example of the carrier ring according to the third embodiment.
Figure 23:
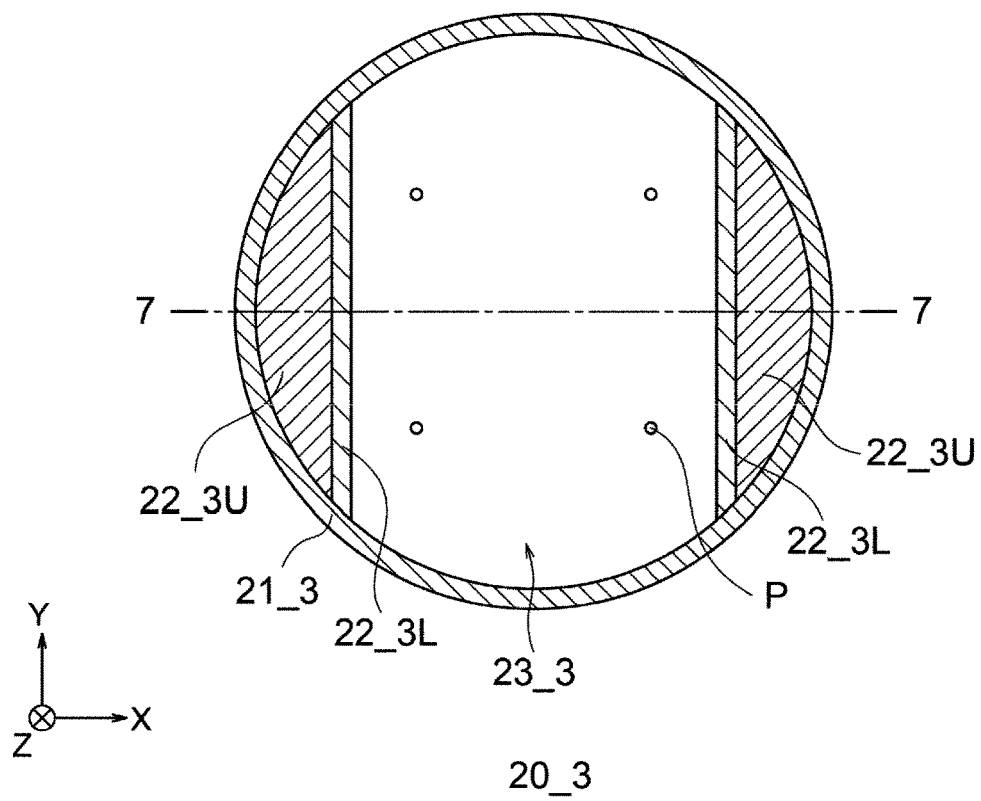
FIG. 23 is a plan view illustrating a configuration example of the carrier ring according to the third embodiment.
Figure 24:
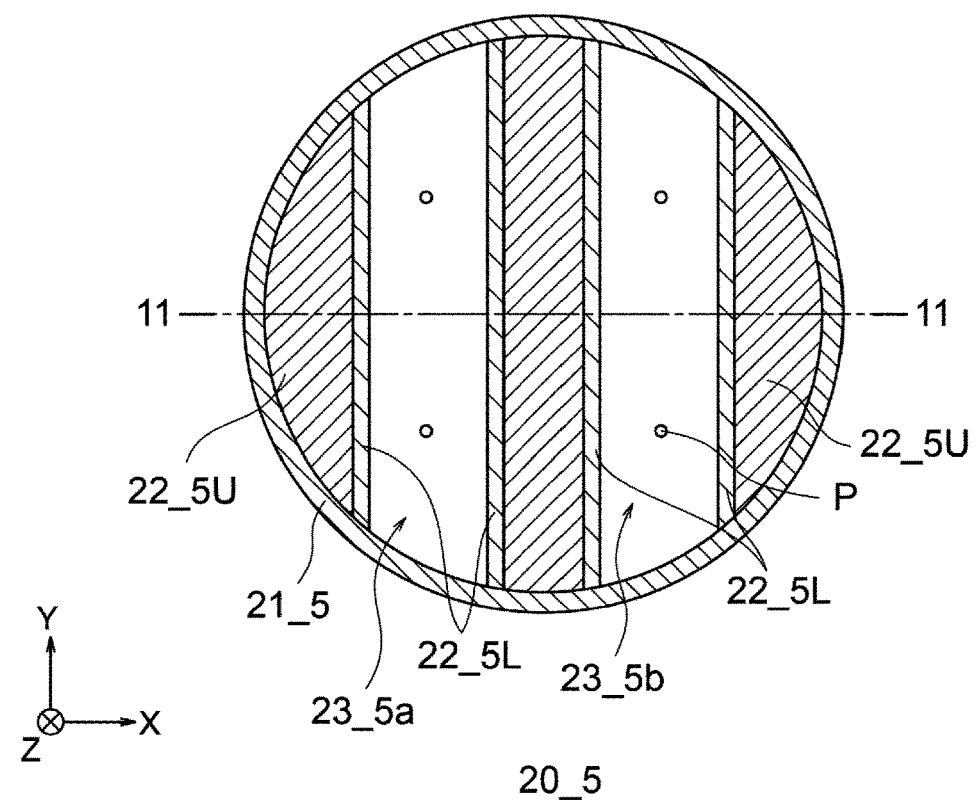
FIG. 24 is a plan view illustrating a configuration example of the carrier ring according to the third embodiment.
Figure 25:
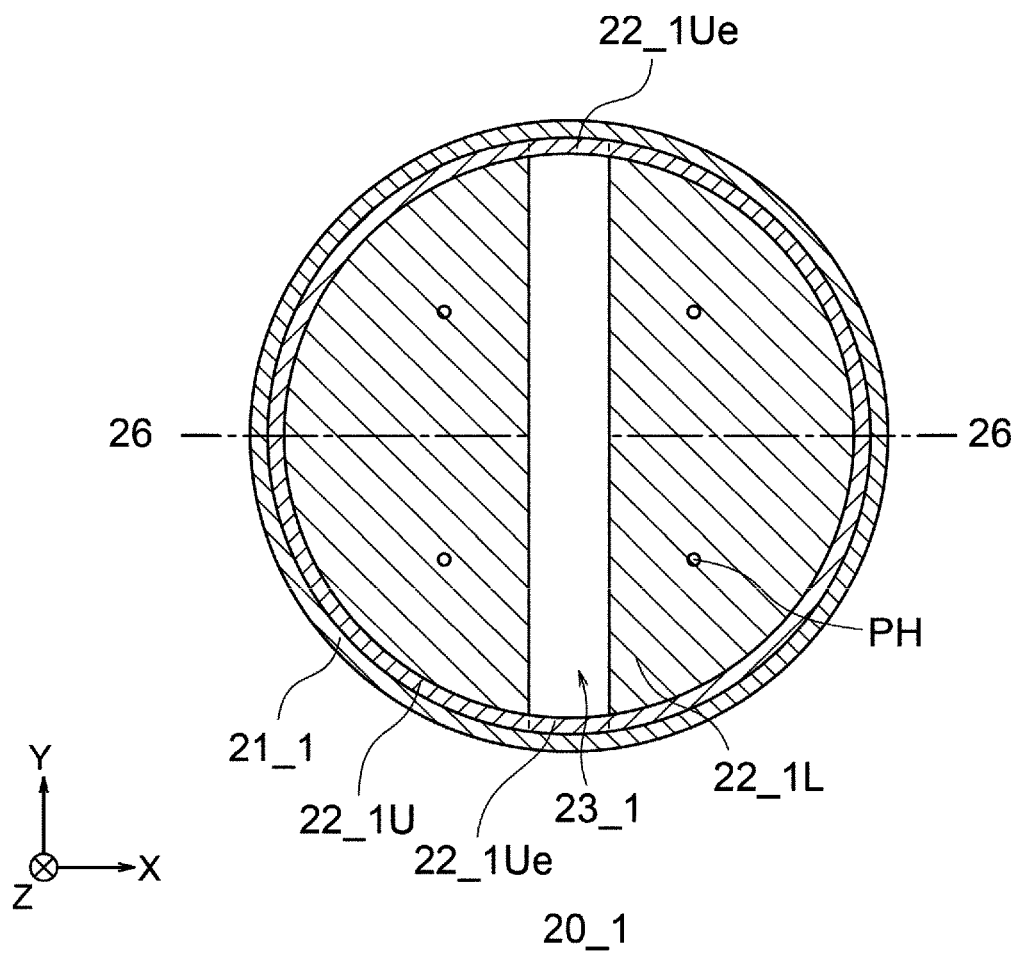
FIG. 25 is a plan view illustrating a configuration example of the carrier ring according to a fourth embodiment.
Figure 26:
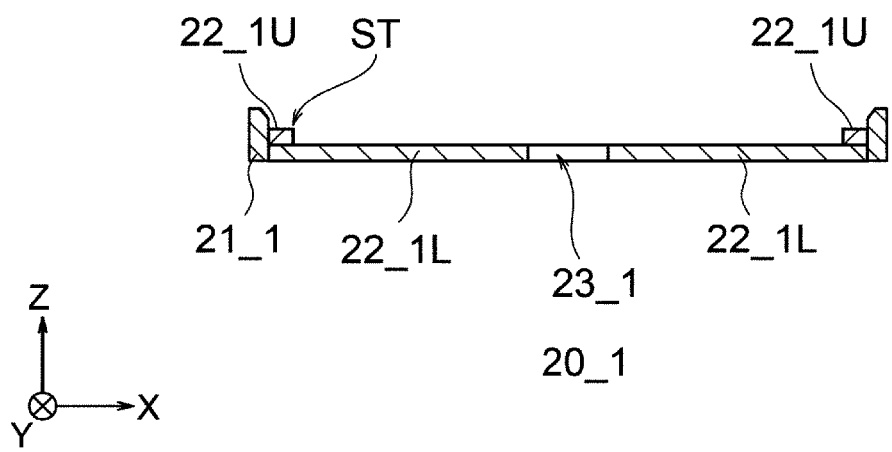
FIG. 26 is a cross-sectional view illustrating a configuration example of the carrier ring according to the fourth embodiment.
Figure 27:
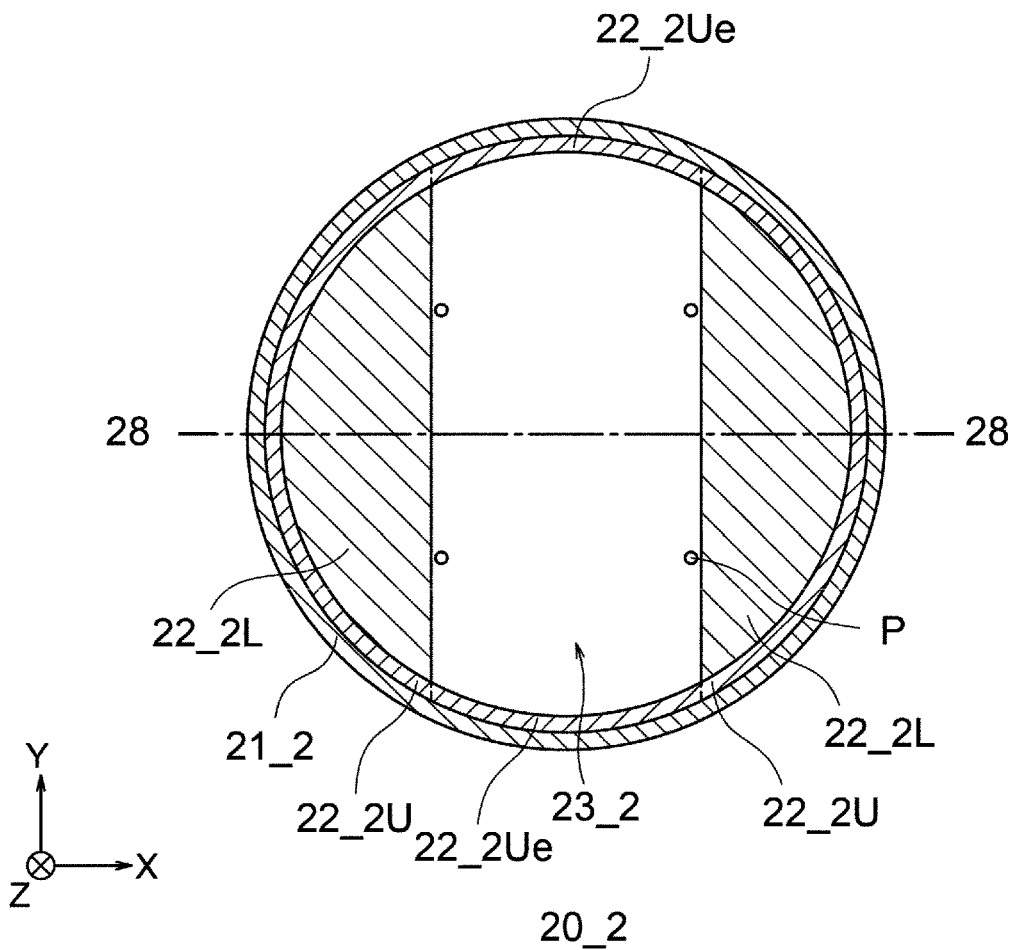
FIG. 27 is a plan view illustrating a configuration example of the carrier ring according to the fourth embodiment.
Figure 28:
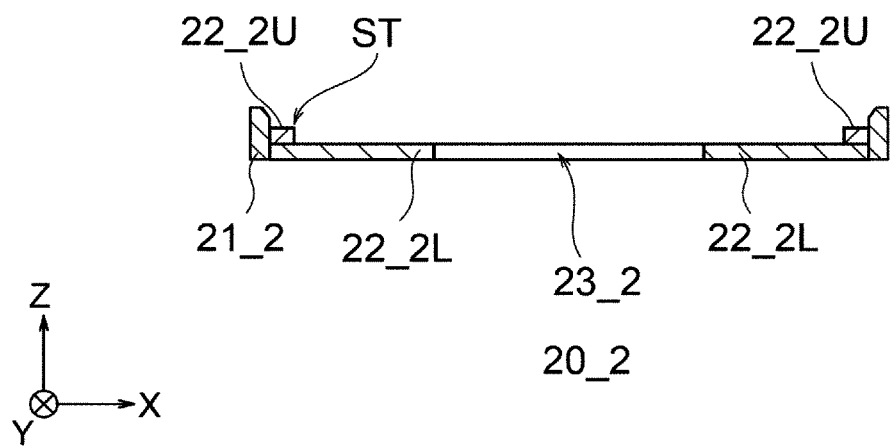
FIG. 28 is a cross-sectional view illustrating a configuration example of the carrier ring according to the fourth embodiment.
Figure 29:
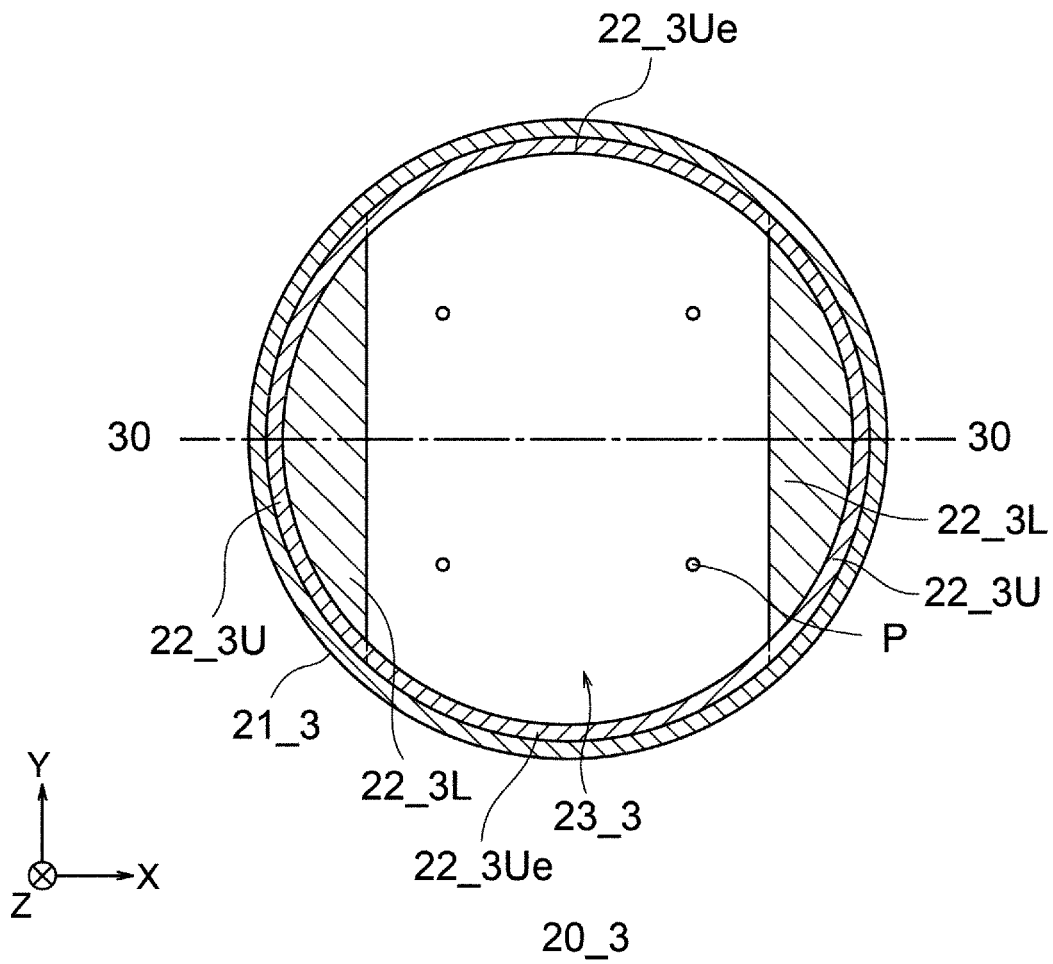
FIG. 29 is a plan view illustrating a configuration example of the carrier ring according to the fourth embodiment.
Figure 30:
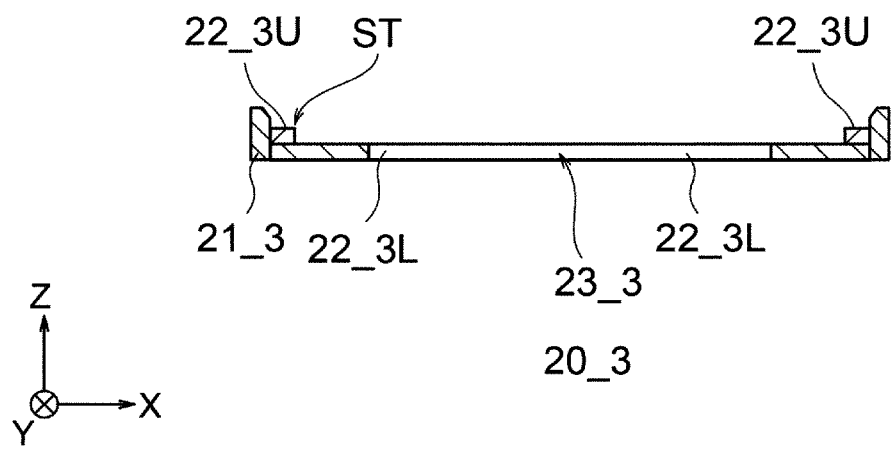
FIG. 30 is a cross-sectional view illustrating a configuration example of the carrier ring according to the fourth embodiment.

If the material film TF is a silicon oxide film, as illustrated in FIG. 16B, the central portion of the substrate W is recessed further than the end portions, and the substrate W warps in a bowl shape. As illustrated in FIG. 15, if the film thickness Ttf of the material film TF (silicon oxide film) becomes thick, the warpage amount of the substrate W increases.

According to the present embodiment, the warpage of the substrate W illustrated in FIG. 14 is corrected by using characteristics illustrated in FIGS. 15, 16A, and 16B. For this purpose, the material film TF in accordance with the warpage state and the warpage amount of the substrate W is formed by partially changing the film thickness on the first surface F1 of the substrate W.

For example, if the substrate W warps in a bowl shape (the center of the substrate W is closer to the lower electrode 60 than the end portions of the substrate W), in order to apply a reverse stress to the substrate W, the silicon nitride film is formed on the first surface F1. For example, in the plasma CVD method, the silicon nitride film is formed by using a gas including $SiH_4$, $NH_3$, $H_2$, $N_2$, and Ar as the process gas. That is, if the center of the substrate W is closer to the lower electrode 60 than the end portions of the substrate W due to the warpage of the substrate W, the gas introduction unit 30 may introduce the process gas including $SiH_4$, $NH_3$, $H_2$, $N_2$, and Ar to the chamber 10.

On the other hand, if the substrate W warps in the mountain shape (the end portions of the substrate W are closer to the lower electrode 60 than the center of the substrate W), in order to apply the reverse stress to the substrate W, the silicon oxide film is formed on the first surface F1. For example, in the plasma CVD method, the silicon oxide film is formed by using a gas including $SiH_4$, $N_2O$, $H_2$, $N_2$, and Ar as the process gas. That is, if the end portions of the substrate W are closer to the lower electrode 60 than the center of the substrate W due to the warpage of the substrate W, the gas introduction unit 30 may introduce the process gas including $SiH_4$, $N_2O$, $H_2$, $N_2$, and Ar to the chamber 10.

For example, when the substrate W warps in a bowl shape as illustrated in FIG. 14, the apparatus 1 deposits the silicon nitride film as the material film TF on the first surface (rear surface) F1 of the substrate W. If the silicon nitride film is deposited on the first surface F1 of the substrate W, the substrate W receives the stress to warp in a mountain shape as opposed to the bowl shape illustrated in FIG. 16A. In this case, in order to effectively correct the warpage in a bowl shape in the Y direction of the substrate W, it is preferable that the material film TF extends in the Y direction and be relatively thick in the central portion of the substrate W in the X direction of FIG. 14. Further, the material film TF may be gradually thinner as it goes further from the central line of the substrate W in the X direction. Accordingly, the warpage of the substrate W is relatively strongly corrected near the central line of the substrate W in the X direction and is more weakly corrected as it goes further from the central line of the substrate W. As a result, the substrate W warping in a bowl shape can be effectively corrected to be nearly flat.

For example, in the apparatus 1, first, the carrier ring 20_1 of FIGS. 2 and 3 is provided in the chamber 10. The substrate W is mounted on the carrier ring 20_1 so that the extending direction of the word lines WL of the substrate W (the Y direction) is substantially parallel to the extending direction of the opening 23_1 of FIG. 2. Subsequently, the controller 100 introduces a process gas at a predetermined flow rate FR1 and supplies the process gas from the lower electrode 60 to the first surface F1 of the substrate W. Accordingly, the material film TF is formed in the central portion of the substrate W corresponding to the opening 23_1 with a predetermined thickness T1 and is not formed in the other areas.

Subsequently, the carrier ring 20_2 of FIGS. 4 and 5 is provided in the chamber 10. The substrate W is mounted on the carrier ring 20_2 so that the extending direction of the word lines WL of the substrate W is substantially parallel to the extending direction of the opening 23_2 (the Y direction). Subsequently, the controller 100 introduces the process gas at a predetermined flow rate FR2 and supplies the process gas from the lower electrode 60 to the first surface F1 of the substrate W. Accordingly, the material film TF is formed in the central portion of the substrate W corresponding to the opening 23_2 with a predetermined thickness T2 and is not formed in the other areas. In this case, the material film TF of the area of the substrate W corresponding to the opening 23_1 has a thickness of T1+T2.

Subsequently, the carrier ring 20_3 of FIGS. 6 and 7 is provided in the chamber 10. The substrate W is mounted on the carrier ring 20_3 so that the extending direction of the word lines WL of the substrate W is substantially parallel to the extending direction of the opening 23_3 (the Y direction). Subsequently, the controller 100 introduces the process gas at a predetermined flow rate FR3 and supplies the process gas from the lower electrode 60 to the first surface F1 of the substrate W. Accordingly, the material film TF is formed in the central portion of the substrate W corresponding to the opening 23_3 with a predetermined thickness T3 and is not formed in the other areas. In this case, the material film TF of the area of the substrate W corresponding to the opening 23_1 has a thickness of T1+T2+T3. The material film TF of the area of the substrate W corresponding to the opening 23_2 other than the opening 23_1 has a thickness of T2+T3.

Subsequently, the carrier ring 20_4 of FIGS. 8 and 9 is provided in the chamber 10. The substrate W is mounted on the carrier ring 20_4 so that the extending direction of the word lines WL of the substrate W becomes substantially parallel to the extending direction of the openings 23_4a and 23_4b (the Y direction). Subsequently, the controller 100 introduces the process gas at a predetermined flow rate FR4 and supplies the process gas from the lower electrode 60 to the first surface F1 of the substrate W. Accordingly, the material film TF is formed in the both end portions of the substrate W corresponding to the openings 23_4a and 23_4b with a predetermined thickness T4 and is not formed in the other areas. In this case, the material film TF is not formed in the areas of the substrate W corresponding to the openings 23_1 to 23_3. Accordingly, in the area of the substrate W corresponding to the opening 23_1, the thickness of the material film TF is T1+T2+T3 without change. The thickness of the material film TF of the area of the substrate W corresponding to the opening 23_2 other than the opening 23_1 is T2+T3 without change. Further, the material film TF of the area of the substrate W corresponding to the opening 23_3 other than the openings 23_1 and 23_2 has a thickness of T3.

Here, if T1+T2+T3>T2+T3>T3>T4 is satisfied, the material film TF is thick in the central portion of the substrate W and becomes thinner as approaching closer to the both end portions in the ±X direction. By forming such a material film TF on the first surface F1 of the substrate W, the warpage of the substrate W by the word lines WL extending in the Y direction of the substrate W can be effectively corrected or controlled with high accuracy.

According to the present embodiment, in this manner, the material film TF is formed on the first surface F1 of the substrate W by using the four carrier rings 20_1 to 20_4 illustrated in FIGS. 2 to 9 with the thickness partially changed. That is, the apparatus 1 includes the four carrier rings 20_1 to 20_4 in which the widths of the openings 23_1 to 23_4 in the X direction are different from each other as one set.

However, the type and the number of the carrier rings 20 are not particularly limited, and the number thereof may be three or less or may be five or more. In addition, the shape of the mask portion 22 is not limited to the shapes of the mask portions 22_1U to 22_4U, and 22_1L to 22_4L of the carrier rings 20_1 to 20_4.

For example, the material film TF may be formed by using the carrier ring 20_1 of FIGS. 2 and 3, the carrier ring 20_5 of FIGS. 10 and 11, and the carrier ring 20_4 of FIGS. 8 and 9.

More specifically, first, the carrier ring 20_1 of FIGS. 2 and 3 is provided in the chamber 10. The substrate W is mounted on the carrier ring 20_1 so that the extending direction of the word lines WL of the substrate W is substantially parallel to the extending direction of the opening 23_1 of FIG. 2 (the Y direction). Subsequently, the controller 100 introduces the process gas at the predetermined flow rate FR1 and supplies the process gas from the lower electrode 60 to the first surface F1 of the substrate W. Accordingly, the material film TF is formed in the central portion of the substrate W corresponding to the opening 23_1 with the predetermined thickness T1, and is not formed in the other areas.

Subsequently, the carrier ring 20_5 of FIGS. 10 and 11 is provided in the chamber 10. The substrate W is mounted on the carrier ring 20_5 so that the extending direction of the word lines WL of the substrate W is substantially parallel to the extending direction of the openings 23_5a and 23_5b (the Y direction). Subsequently, the controller 100 introduces the process gas at a predetermined flow rate FR5 and supplies the process gas from the lower electrode 60 to the first surface F1 of the substrate W. Accordingly, the material film TF is formed in the areas of the substrate W corresponding to the openings 23_5a and 23_5b with a predetermined thickness T5, and is not formed in the other areas. That is, the material film TF is not formed in the central portion of the substrate W corresponding to the opening 23_1.

Subsequently, the carrier ring 20_4 of FIGS. 8 and 9 is provided in the chamber 10. The substrate W is mounted on the carrier ring 20_4 so that the extending direction of the word lines WL of the substrate W is substantially parallel to the extending direction of the openings 23_4a and 23_4b (the Y direction). Subsequently, the controller 100 introduces the process gas at the predetermined flow rate FR4 and supplies the process gas from the lower electrode 60 to the first surface F1 of the substrate W. Accordingly, the material film TF is formed in the both end portions of the substrate W corresponding to the openings 23_4a and 23_4b with the predetermined thickness T4, and is not formed in the other areas. At this point, the material film TF is not formed in the areas of the substrate W corresponding to the openings 23_1, 23_5a, and 23_5b. Accordingly, the thickness of the material film TF is T1 without change, in the area of the substrate W corresponding to the opening 23_1. The thickness of the material film TF in the areas of the substrate W corresponding to the openings 23_5a and 23_5b is T5 without change. Further, the material film TF in the areas of the substrate W corresponding to the openings 23_4a and 23_4b has a thickness of T4.

Here, if T1>T5>T4 is satisfied, the material film TF is thick in the central portion of the substrate W and becomes thinner as approaching closer to the both end portions in the ±X direction. In this manner, the material film TF on the first surface F1 of the substrate W is formed by using the three carrier rings 20_1, 20_5, and 20_4, so that the warpage of the substrate W by the word lines WL extending in the Y direction of the substrate W can be effectively corrected or controlled with high accuracy.

Second Embodiment

FIGS. 17 to 20 are plan views illustrating configuration examples of the carrier rings 20_1 to 20_3, and 20_5 according to a second embodiment. Further, the carrier ring 20_4 according to the second embodiment may have the same configuration as the configuration illustrated in FIGS. 8 and 9. In addition, cross sections taken along the line 3-3, the line 5-5, the line 7-7, and the line 11-11 of FIGS. 17 to 20 may be the same as the cross sections illustrated in FIGS. 3, 5, 7, and 11, respectively.

According to the second embodiment, in the both end portions of the openings 23_1 to 23_3, 23_5a, and 23_5b of the carrier rings 20_1 to 20_3, and 20_5 in the Y direction, the end portions 22_1Ue to 22_5Ue of the mask portions 22_1U to 22_3U, and 22_5U are provided in the inner edge portion of the outer edge portion 21_1. However, the end portions 22_1Le to 22_5Le of the mask portions 22_1L to 22_3L, and 22_5L that protrude to the openings 23_1 to 23_3, 23_5a, and 23_5b side with respect to the end portions 22_1Ue to 22_5Ue are not provided. That is, near the both end portions of the openings 23_1 to 23_3, 23_5a, and 23_5b in the Y direction, the step portion ST is not provided between the mask portions 22_1U to 22_3U, and 22_5U and the mask portions 22_1L to 22_3L, and 22_5L. Further, the end portions 22_1Le to 22_5Le may not constitute the step portion ST, but may be overlapped with the end portions 22_1Ue to 22_5Ue. The rest of the configurations of the carrier rings 20_1 to 20_3, and 20_5 according to the second embodiment may be the same as those according to the first embodiment.

Near the both end portions of the openings 23_1 to 23_3, 23_5a, and 23_5b in the Y direction, if the step portion ST is not formed, when the material film TF is formed on the first surface F1 of the substrate W, burrs may remain in the areas of the substrate W corresponding to the end portions 22_1Ue to 22_5Ue. However, the areas of the substrate W corresponding to the end portions 22_1Ue to 22_5Ue are the outer edge portions of the substrate W, and burrs of the material film TF can be removed by a bevel etching process. In other words, even if the material film TF is formed with the carrier rings 20_1 to 20_5 according to the second embodiment, thereafter, burrs of the material film TF may be removed by the bevel etching process. Accordingly, in the second embodiment, the same effect as in the first embodiment can be obtained.

Third Embodiment

FIGS. 21 to 24 are plan views illustrating configuration examples of the carrier rings 20_1 to 20_3, and 20_5 according to a third embodiment. Further, the carrier ring 20_4 according to the third embodiment may have the same configuration as the configuration illustrated in FIGS. 8 and 9. In addition, cross sections taken along the line 3-3, the line 5-5, the line 7-7, the line 11-11 of FIGS. 21 to 24 may be the same as the cross sections illustrated in FIGS. 3, 5, 7, and 11, respectively.

According to the third embodiment, in the both end portions of the openings 23_1 to 23_3, 23_5a, and 23_5b of the carrier rings 20_1 to 20_3, and 20_5 in the Y direction, none of the end portions 22_1Ue to 22_5Ue of the mask portions 22_1U to 22_3U, and 22_5U, and the end portions 22_1Le to 22_5Le of the mask portions 22_1L to 22_3L, and 22_5L are provided in the inner edge portion of the outer edge portion 21_1. The rest of the configurations of the carrier rings 20_1 to 20_3, and 20_5 according to the third embodiment may be the same as those according to the first embodiment.

If the end portions 22_1Ue to 22_5Ue, and 22_1Le to 22_5Le are not provided, when the material film TF is formed on the first surface F1 of the substrate W, the material film TF may be formed in the edge portion of the side surface of the substrate W. However, the areas of the substrate W corresponding to the end portions 22_1Ue to 22_5Ue are the outer edge portions of the substrate W, and the unnecessary material film TF can be removed by the bevel etching process. In other words, even if the material film TF is formed with the carrier rings 20_1 to 20_5 according to the third embodiment, thereafter, burrs of the material film TF may be removed by the bevel etching process. Accordingly, in the third embodiment, the same effect as in the first embodiment can be obtained.

Fourth Embodiment

FIGS. 25, 27, 29, 31, and 33 are plan views illustrating configuration examples of the carrier rings 20_1 to 20_5 according to a fourth embodiment. FIGS. 26, 28, 30, 32, and 34 are cross-sectional views illustrating configuration examples of the carrier rings 20_1 to 20_5 according to the fourth embodiment. FIGS. 25 to 34 are diagrams illustrating the configuration examples of the carrier rings 20_1 to 20_5 according to the fourth embodiment.

According to the fourth embodiment, the mask portions 22_1U to 22_5U are provided along the outer edge portions 21_1 to 21_5 of the carrier rings 20_1 to 20_5, respectively. That is, the mask portions 22_1U to 22_5U do not extend to the edge portions of the opening 23_1 to 23_5b, but are provided only in the inner edge portions of the outer edge portions 21_1 to 21_5. In addition, the mask portion 22_1L to 22_5L are partially provided in the areas surrounded by the outer edge portions 21_1 to 21_5 of the carrier rings 20_1 to 20_5, and cover the both end portions and/or the central portion of the first surface F1 of the substrate W in the ±X direction (first area). Accordingly, the step portion ST configured with the mask portions 22_1U to 22_5U and the mask portion 22_1L to 22_5L are provided along the outer edge portions 21_1 to 21_5. According to the fourth embodiment, the end portions 22_1Ue to 22_3Ue and 22_5Ue of the mask portions 22_1U to 22_3U, and 22_5U are provided in the both end portions of the openings 23_1 to 23_3, 23_5a, and 23_5b in the Y direction.

Figure 31:
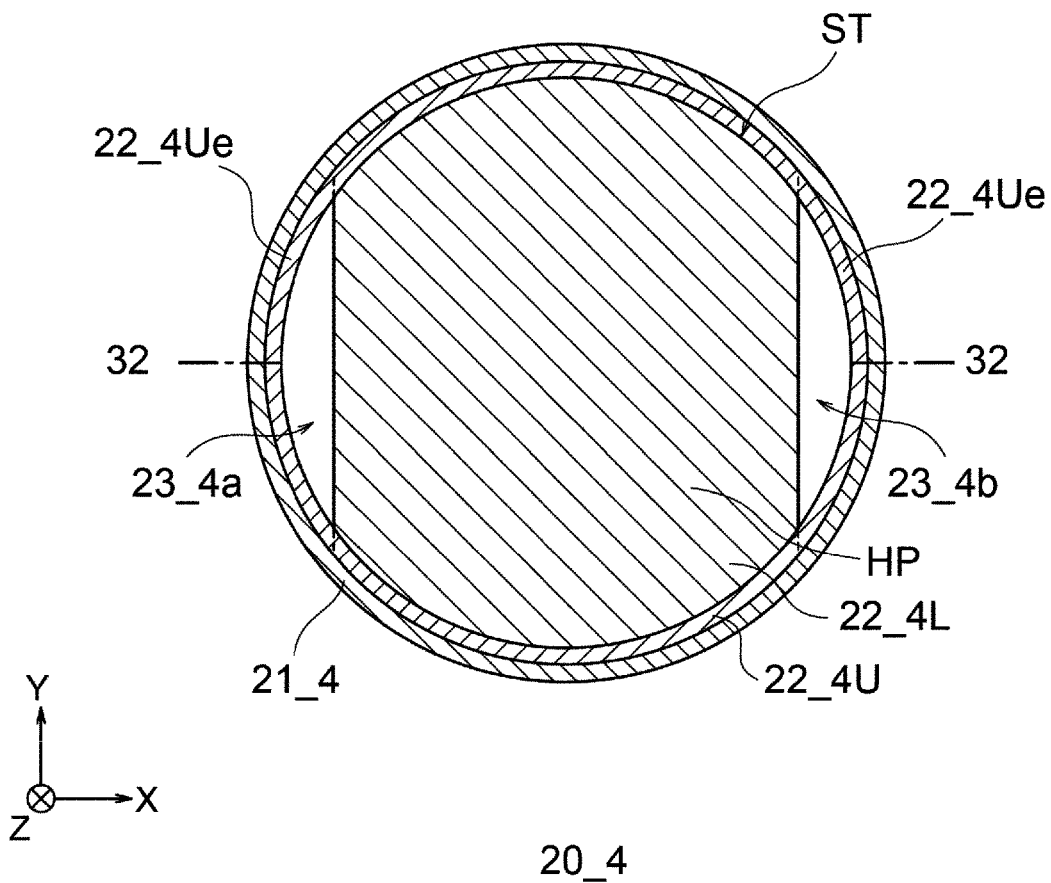
FIG. 31 is a plan view illustrating a configuration example of the carrier ring according to the fourth embodiment.
Figure 32:
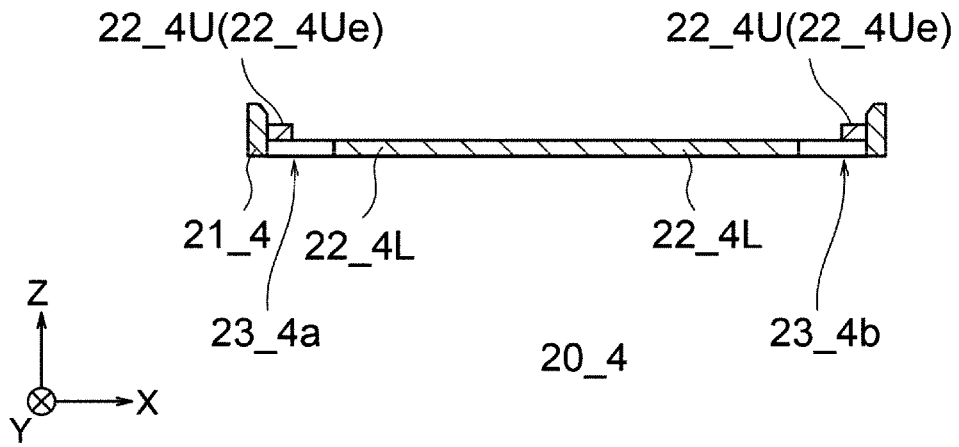
FIG. 32 is a cross-sectional view illustrating a configuration example of the carrier ring according to the fourth embodiment.
Figure 33:
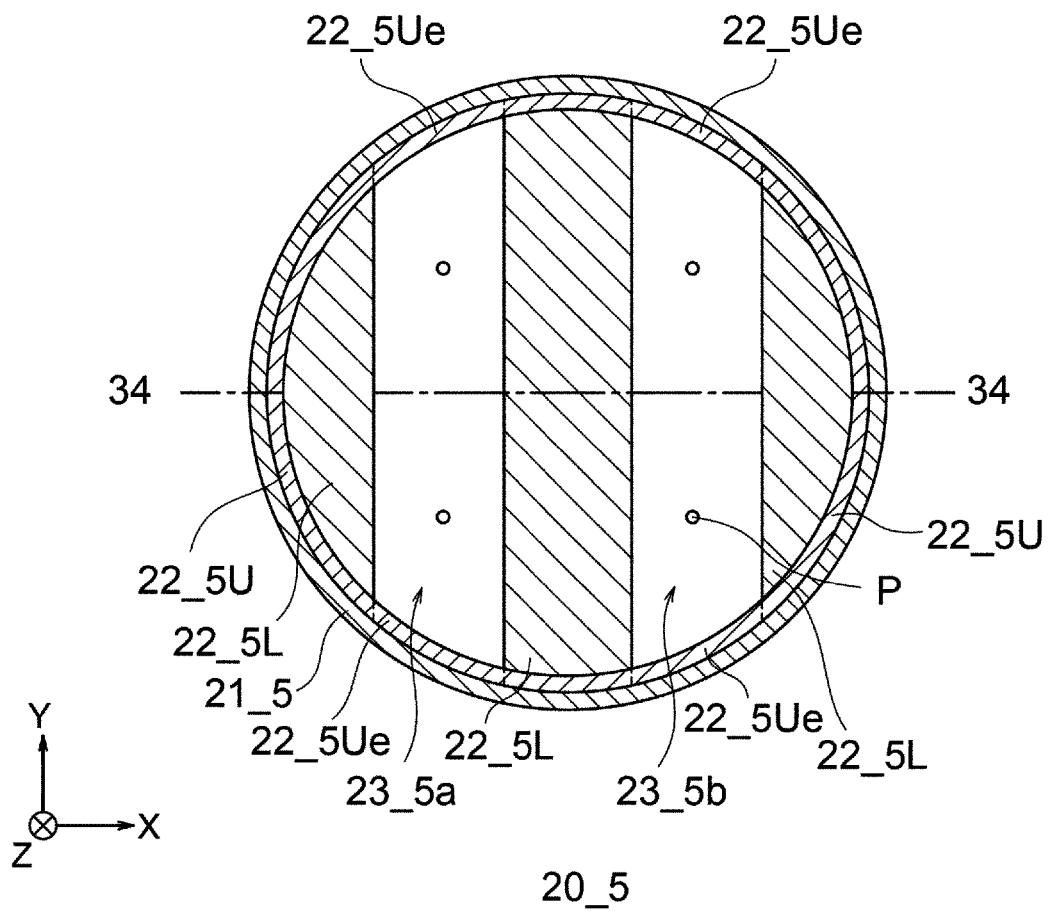
FIG. 33 is a plan view illustrating a configuration example of the carrier ring according to the fourth embodiment.
Figure 34:
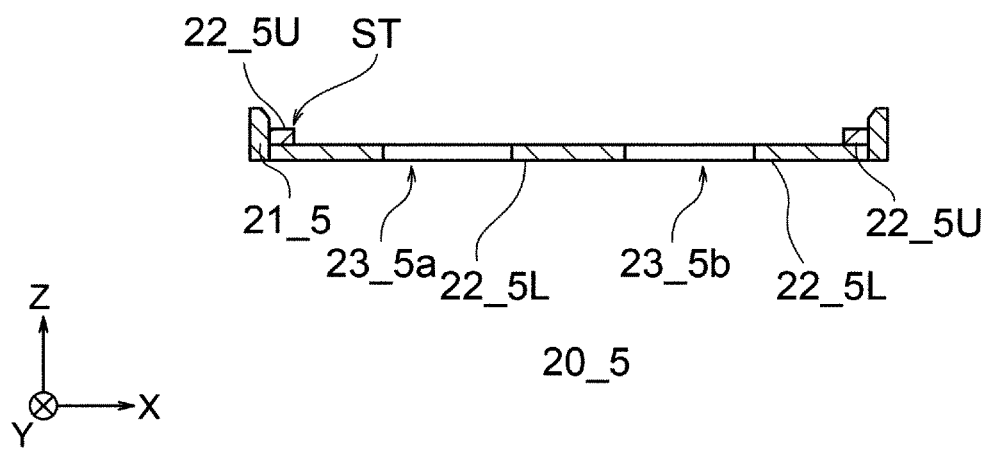
FIG. 34 is a cross-sectional view illustrating a configuration example of the carrier ring according to the fourth embodiment.
Figure 35:
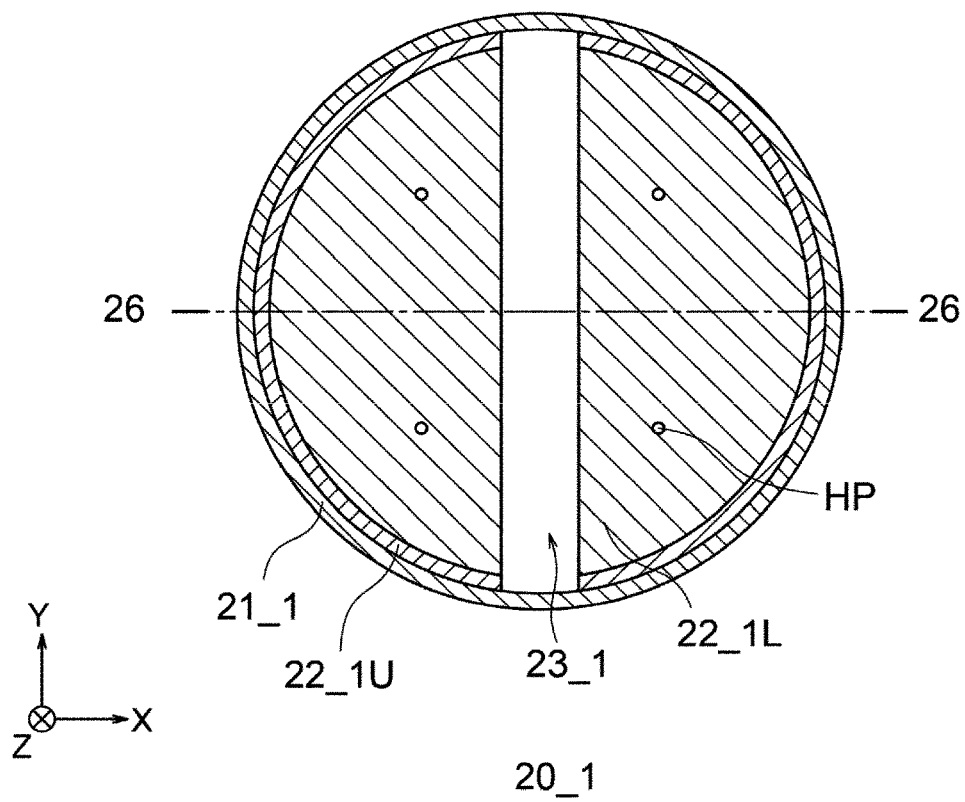
FIG. 35 is a plan view illustrating a configuration example of the carrier ring according to a fifth embodiment.
Figure 36:
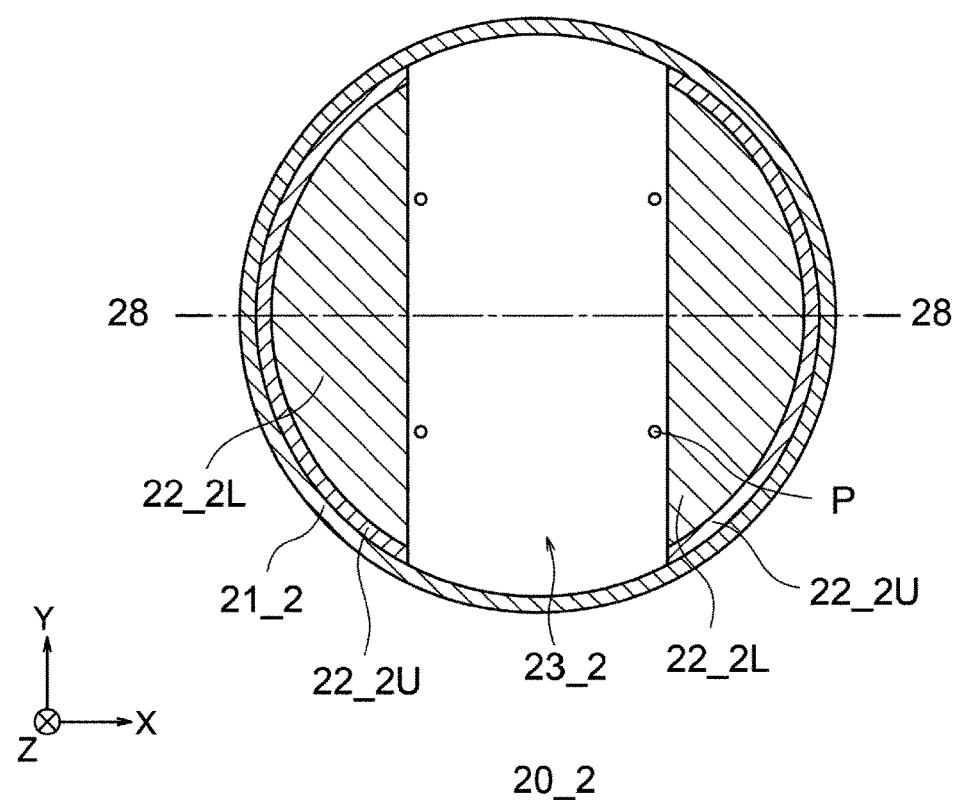
FIG. 36 is a plan view illustrating a configuration example of the carrier ring according to the fifth embodiment.
Figure 37:
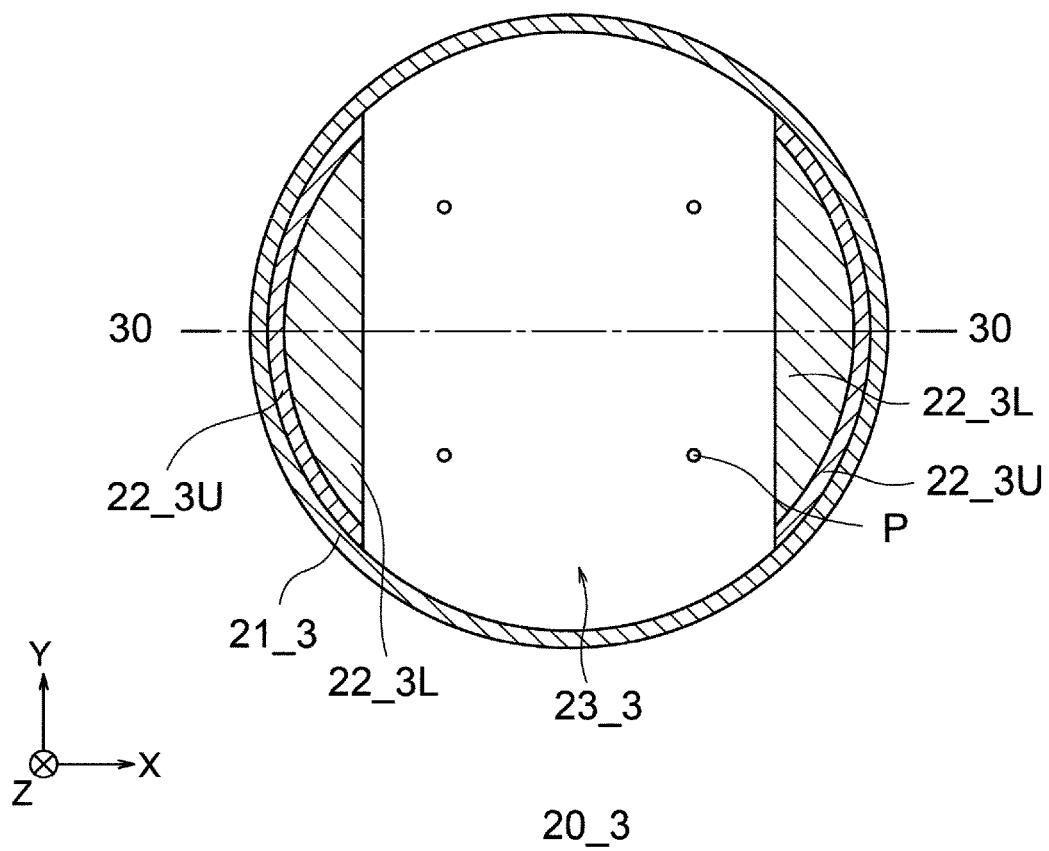
FIG. 37 is a plan view illustrating a configuration example of the carrier ring according to the fifth embodiment.

Further, in the carrier ring 20_4 of FIG. 31, the mask portion 22_4U is provided along the entire outer edge portion 21_4 of the carrier ring 20_4. In addition, the carrier ring 20_4 includes the plurality of openings 23_4a and 23_4b in the both end portions in the X direction. The mask portion 22_4L is provided in the central portion of the carrier ring 20_4 (first area), and the openings 23_4a and 23_4b provided on both sides of the mask portion 22_4L in the X direction expose the second area of the first surface F1 of the substrate W. Among the edge portions of the openings 23_4a and 23_4b, in a portion corresponding to the outer edge portion 21_4, the mask portion 22_4U is provided. The mask portion 22_4L is provided in other edge portions of the openings 23_4a and 23_4b than that described above. Hereinafter, in the carrier ring 20_4, in the both end portions in the X direction, the mask portion 22_4U provided in the inner edge portion of the outer edge portion 21_4 facing the openings 23_4a and 23_4b is referred to as the end portion 22_4Ue. In this manner, in the first area in which the mask portion 22_4L covers the first surface F1 of the substrate W, the mask portion 22_4U does not extend to the edge portions of the openings 23_4a and 23_4b, the end portion 22_4Ue of the mask portion 22_4U is provided only in the inner edge portion of the outer edge portion 21_4. Accordingly, in the inner edge portion on both sides of the outer edge portion 21_4 in the Y direction except for the both end portions in the X direction, in which the openings 23_4a and 23_4b are provided, the step portion ST configured with the mask portion 22_4U and the mask portion 22_4L are provided along the outer edge portion 21_4.

The rest of the configurations of the carrier rings 20_1 to 20_5 according to the fourth embodiment may be the same as those according to the first embodiment.

According to the fourth embodiment, the step portion ST is provided along the outer edge portions 21_1 to 21_5, but when the substrate W is mounted on the carrier rings 20_1 to 20_5, the distance between the substrate W and the mask portion 22_1L to 22_5L is maintained. Accordingly, even if the material film TF is formed by using the carrier rings 20_1 to 20_5 according to the fourth embodiment, the same effect as in the first embodiment can be obtained.

Fifth Embodiment

FIGS. 35 to 39 are plan views illustrating configuration examples of the carrier rings 20_1 to 20_5 according to a fifth embodiment. The cross sections of the carrier rings 20_1 to 20_5 according to the fifth embodiment respectively correspond to the cross sections of FIGS. 26, 28, 30, 32, and 34. Further, the cross section of the carrier ring 20_4 is a cross section obtained by removing the end portion 22_4Ue from the configuration of FIG. 32.

The fifth embodiment is a combination of the fourth embodiment and the third embodiment.

According to the fifth embodiment, in the opening 23_1 to 23_5b of the carrier rings 20_1 to 20_5, the end portions 22_1Ue to 22_5Ue of the mask portions 22_1U to 22_5U which are the both end portions in the Y direction are not provided. The rest of the configurations of the carrier rings 20_1 to 20_3, and 20_5 according to the fifth embodiment may be the same as those according to the fourth embodiment.

Figure 38:
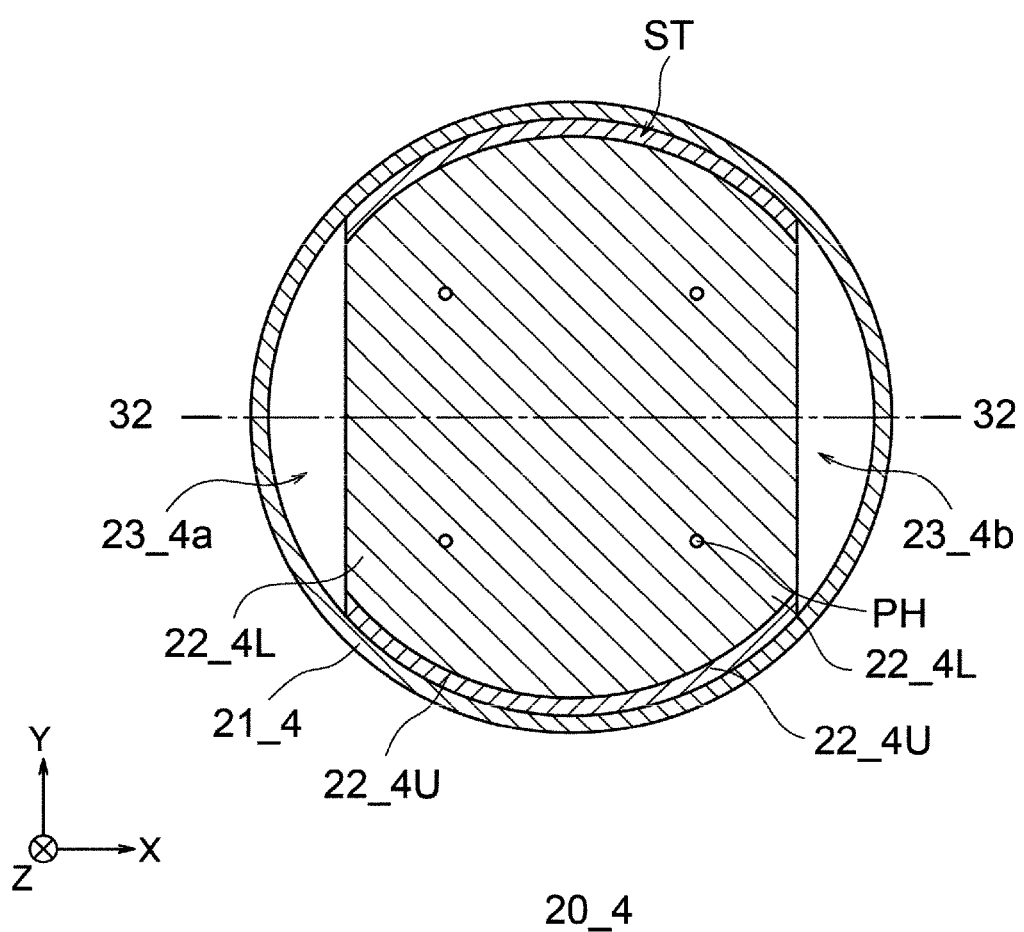
FIG. 38 is a plan view illustrating a configuration example of the carrier ring according to the fifth embodiment.
Figure 39:
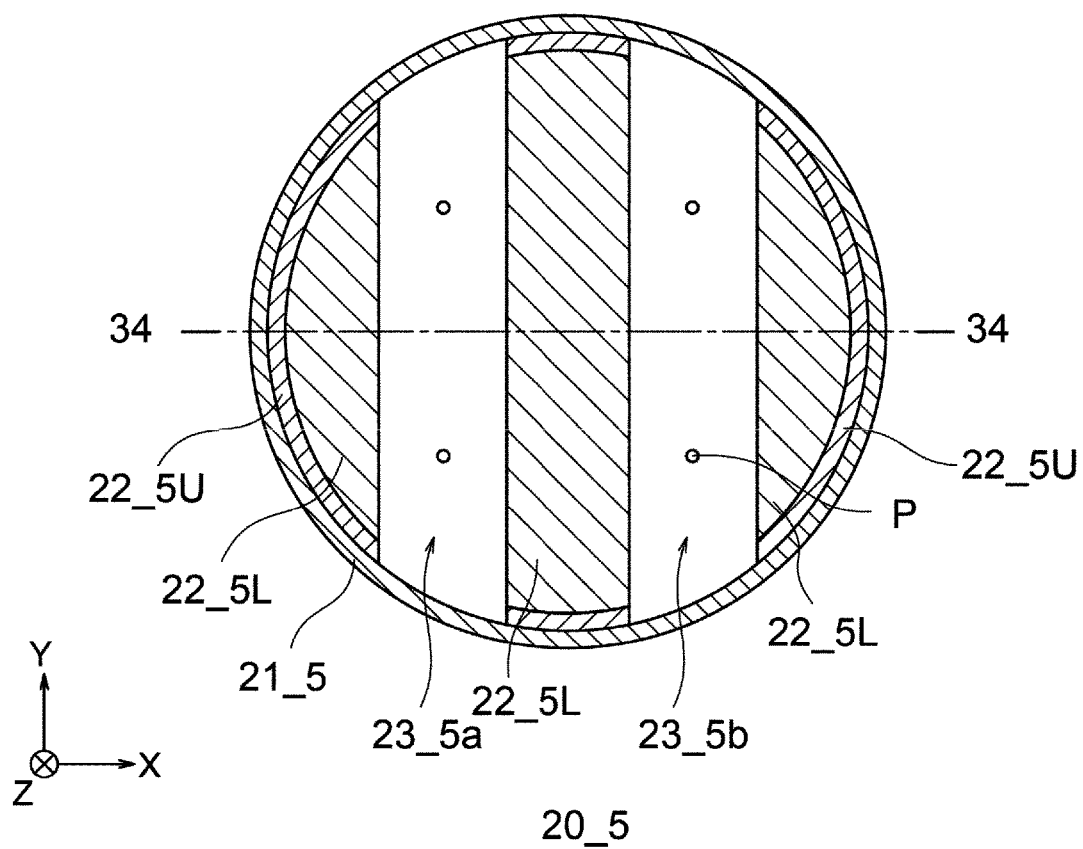
FIG. 39 is a plan view illustrating a configuration example of the carrier ring according to the fifth embodiment.
Figure 40:
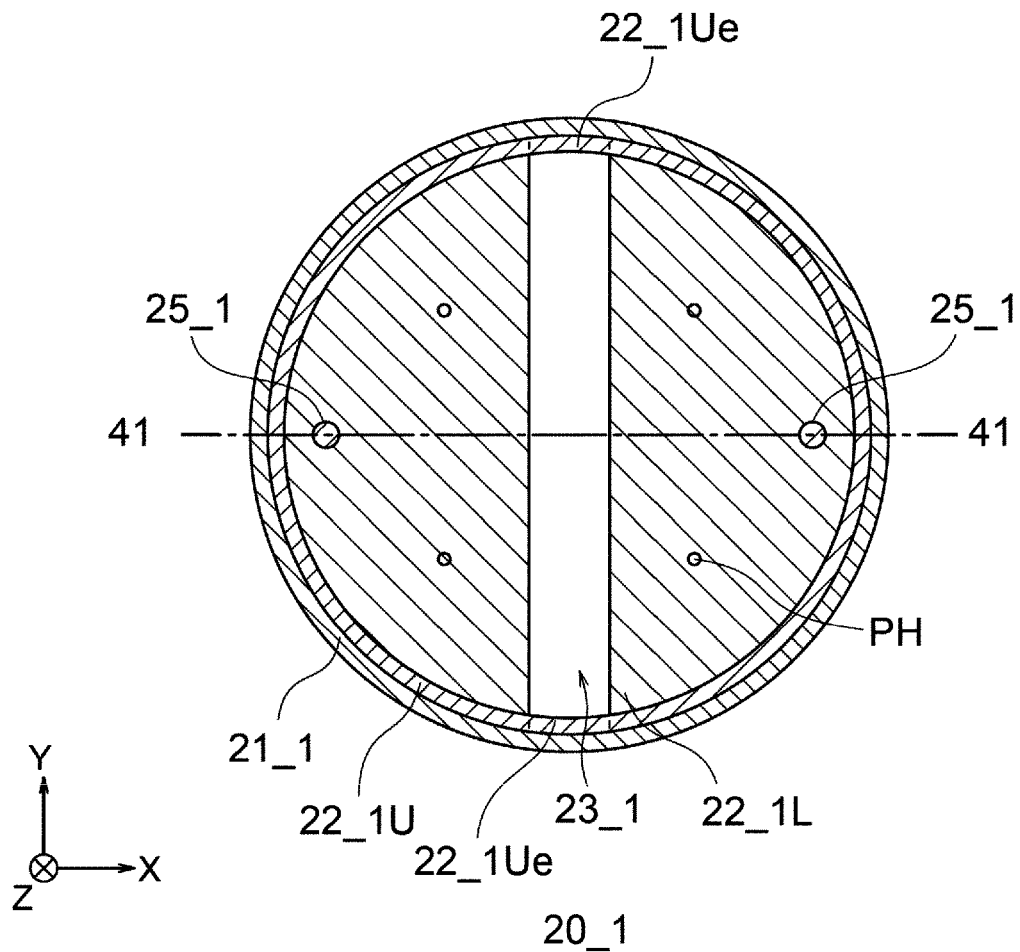
FIG. 40 is a plan view illustrating a configuration example of the carrier ring according to a sixth embodiment.
Figure 41:
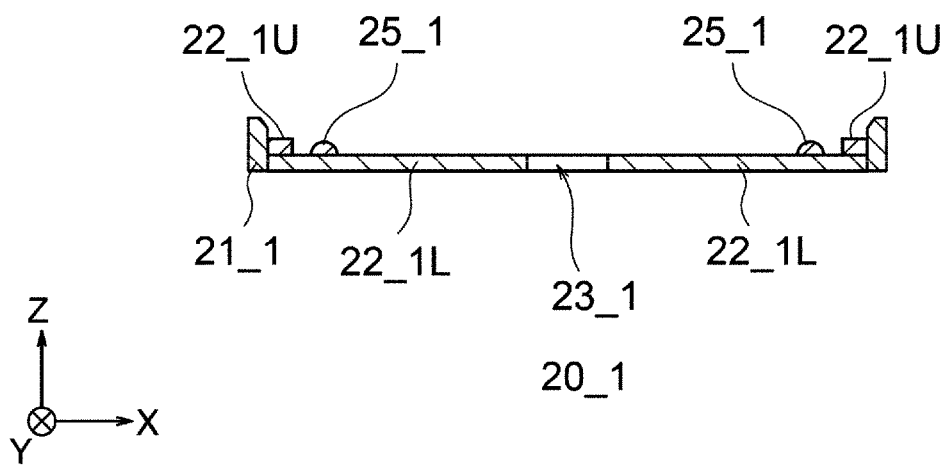
FIG. 41 is a cross-sectional view illustrating a configuration example of the carrier ring according to the sixth embodiment.
Figure 42:
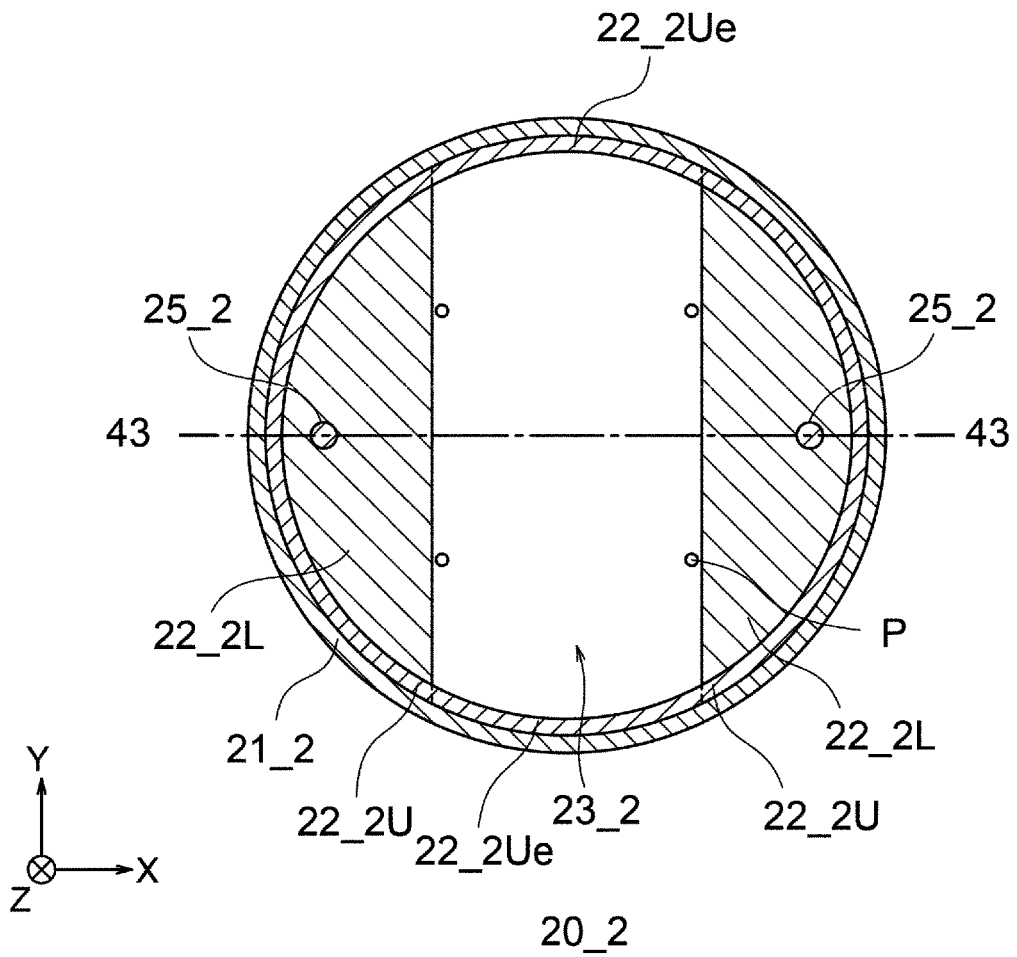
FIG. 42 is a plan view illustrating a configuration example of the carrier ring according to the sixth embodiment.
Figure 43:
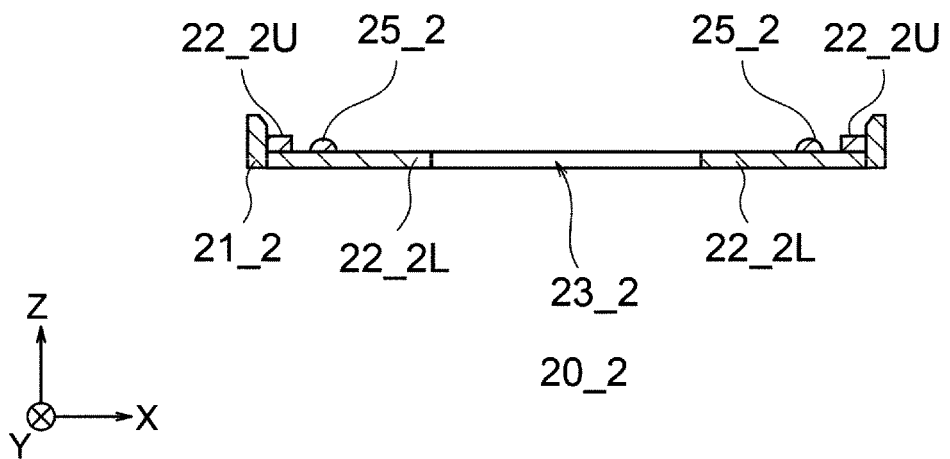
FIG. 43 is a cross-sectional view illustrating a configuration example of the carrier ring according to the sixth embodiment.
Figure 44:
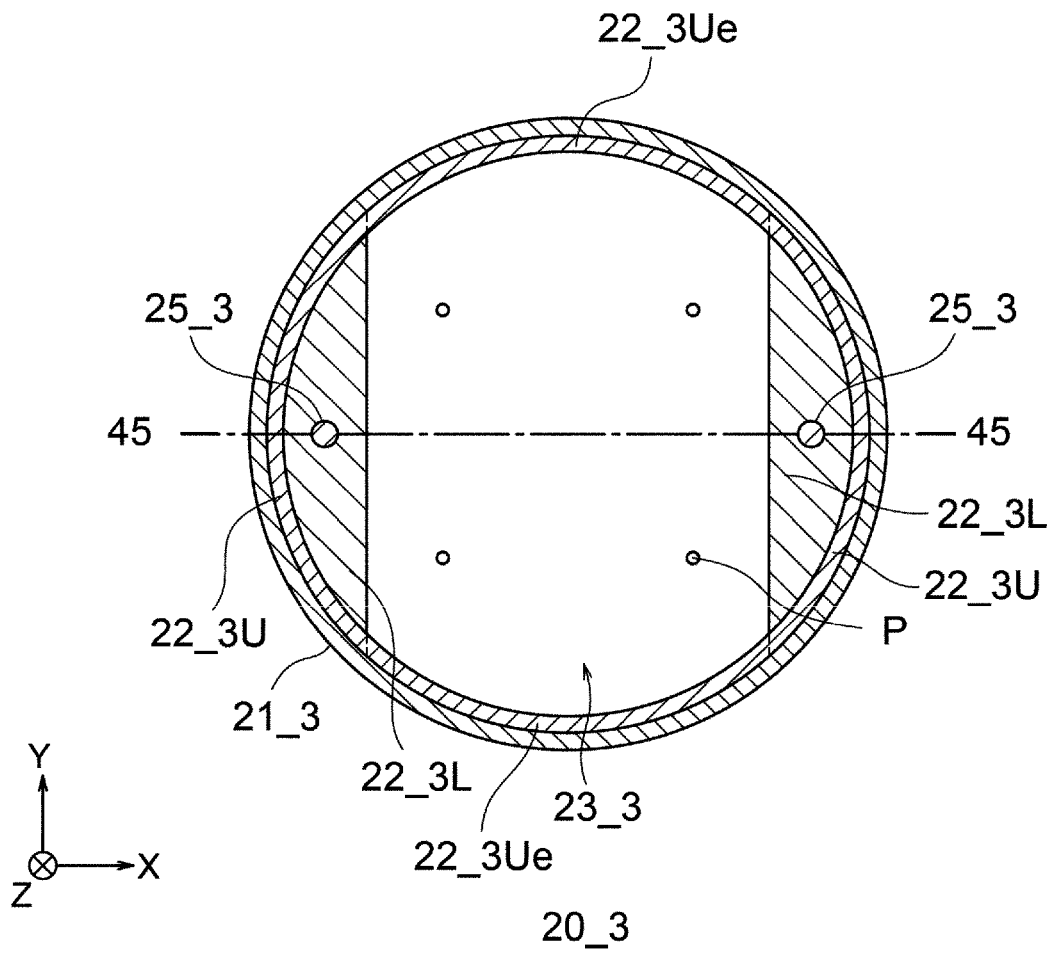
FIG. 44 is a plan view illustrating a configuration example of the carrier ring according to the sixth embodiment.
Figure 45:
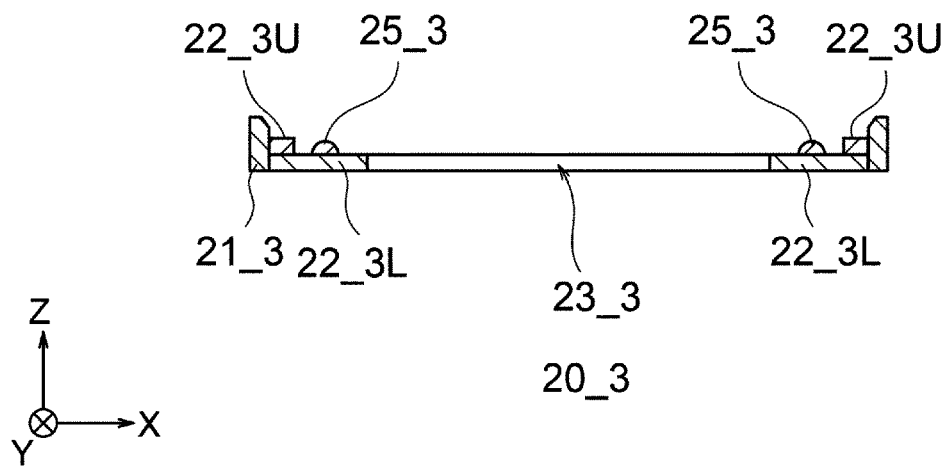
FIG. 45 is a cross-sectional view illustrating a configuration example of the carrier ring according to the sixth embodiment.

Further, in the carrier ring 20_4 of FIG. 38, the mask portion 22_4U is provided along a portion of the outer edge portion 21_4 of the carrier ring 20_4. The mask portion 22_4U is not provided in the outer edge portion 21_4 facing the openings 23_4a and 23_4b. The mask portion 22_4U is provided in the portion other than the openings 23_4a and 23_4b in the outer edge portion 21_4 of the carrier ring 20_4. The rest of the configuration of the carrier ring 20_4 of FIG. 38 may be the same as that of the carrier ring 20_4 of FIG. 31. That is, in the first area in which the mask portion 22_4L covers the first surface F1 of the substrate W, the mask portion 22_4U does not extend to the edge portions of the openings 23_4a and 23_4b, but is provided only in the inner edge portion of the outer edge portion 21_4. Accordingly, the step portion ST that is configured with the mask portion 22_4U and the mask portion 22_4L is provided along the outer edge portion 21_4.

If the end portions 22_1Ue to 22_5Ue are not provided, when the material film TF is formed on the first surface F1 of the substrate W, the material film TF may be formed in the edge portion of the side surface of the substrate W. However, the areas of the substrate W corresponding to the end portions 22_1Ue to 22_5Ue are the outer edge portions of the substrate W, and the unnecessary material film TF can be removed by the bevel etching process. In other words, even if the material film TF is formed with the carrier rings 20_1 to 20_5 according to the fifth embodiment, thereafter, burrs of the material film TF may be removed by the bevel etching process. Accordingly, in the fifth embodiment, the same effect as in the fourth embodiment can be obtained.

Sixth Embodiment

FIGS. 40, 42, 44, 46, and 48 are plan views illustrating configuration examples of the carrier rings 20_1 to 20_5 according to a sixth embodiment. FIGS. 41, 43, 45, 47, and 49 are cross-sectional views illustrating configuration examples of the carrier rings 20_1 to 20_5 according to the sixth embodiment.

The carrier rings 20_1 to 20_5 according to the sixth embodiment include protrusion portions 25_1 to 25_5, respectively. The protrusion portions 25_1 to 25_5 are dispersed and substantially evenly located on the mask portion 22_1L to 22_5L.

For example, in the carrier rings 20_1 to 20_3 of FIGS. 40 to 45, the protrusion portions 25_1 to 25_3 are located two by two, on the mask portions 22_1L to 22_3L on both sides with the openings 23_1 to 23_3 interposed therebetween, in an island shape. The protrusion portions 25_1 to 25_3 are substantially evenly located on the center axis of the carrier rings 20_1 to 20_3 extending in the X direction, at a substantially equal distance from the center of the carrier rings 20_1 to 20_3 and the substrate W. The protrusion portions 25_1 to 25_3 have substantially the same height (height in the Z direction) as the mask portions 22_1U to 22_3U, and are configured with the same material as the mask portions 22_1U to 22_3U. Accordingly, when the substrate W is placed on the carrier rings 20_1 to 20_3, the protrusion portions 25_1 to 25_3 support the substrate W from the first surface F1 side. As a result, the substrate W can be prevented from being in contact with the mask portions 22_1L to 22_3L, and thus burrs can be prevented from being generated on the material film TF.

Figure 46:
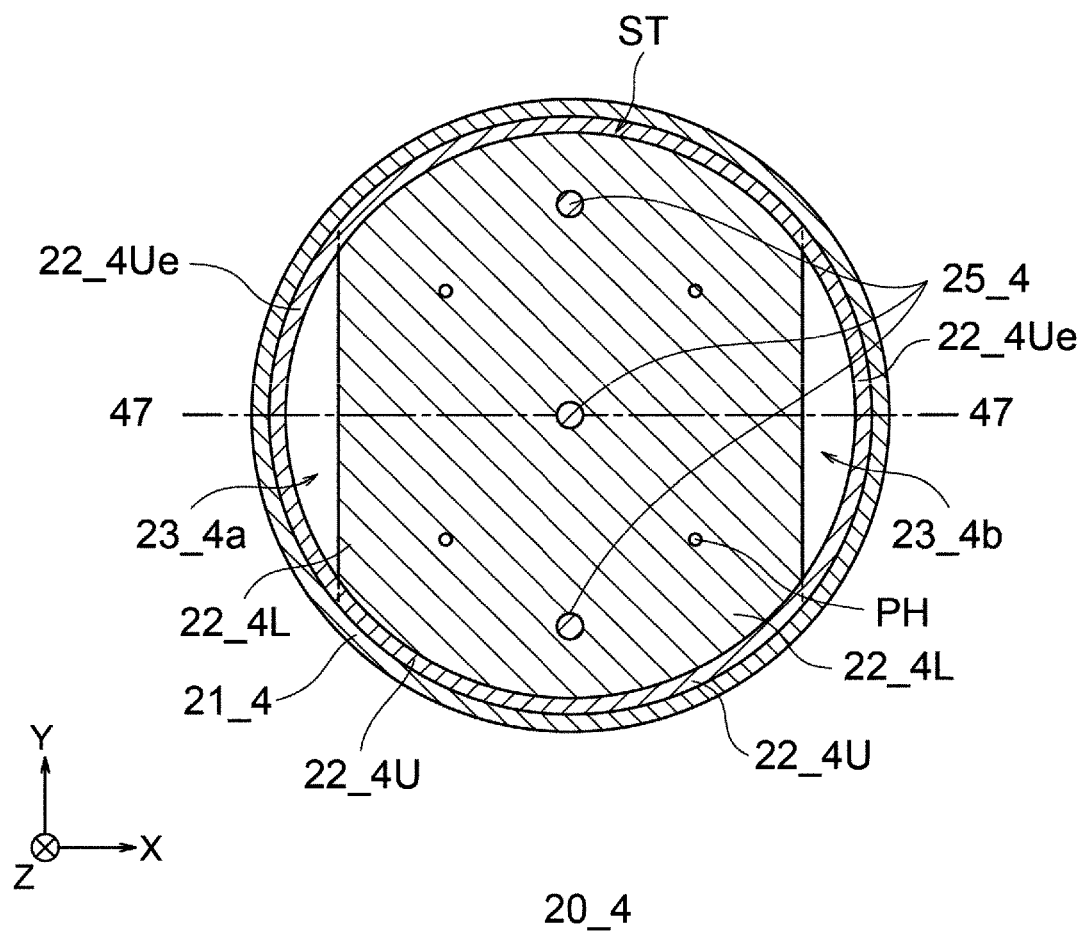
FIG. 46 is a plan view illustrating a configuration example of the carrier ring according to the sixth embodiment.
Figure 47:
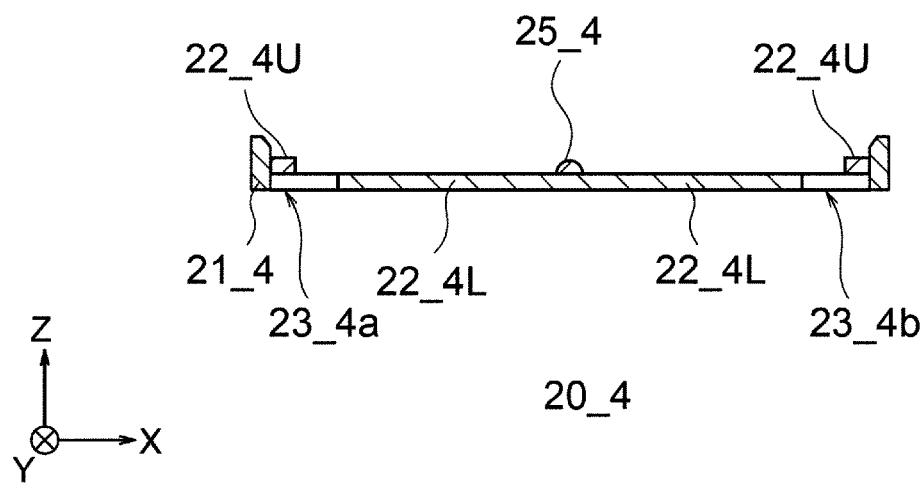
FIG. 47 is a cross-sectional view illustrating a configuration example of the carrier ring according to the sixth embodiment.

In the carrier ring 20_4 of FIGS. 46 and 47, the three protrusion portions 25_4 are located on the mask portion 22_4L in the extending direction of the openings 23_4a and 23_4b (the Y direction). The protrusion portions 25_4 are substantially evenly located on the center axis of the carrier ring 20_4 extending in the Y direction, in the center of the carrier ring 20_4 and the substrate W and at a substantially equal distance from the center. The protrusion portions 25_4 has substantially the same height as the mask portion 22_4U (the height in the Z direction) and is configured with the same material as the mask portion 22_4U. Accordingly, when the substrate W is placed on the carrier ring 20_4, the protrusion portions 25_4 supports the substrate W from the first surface F1 side. As a result, the substrate W can be prevented from being in contact with the mask portion 22_4L, and burrs can be prevented from being generated in the material film TF.

Figure 48:
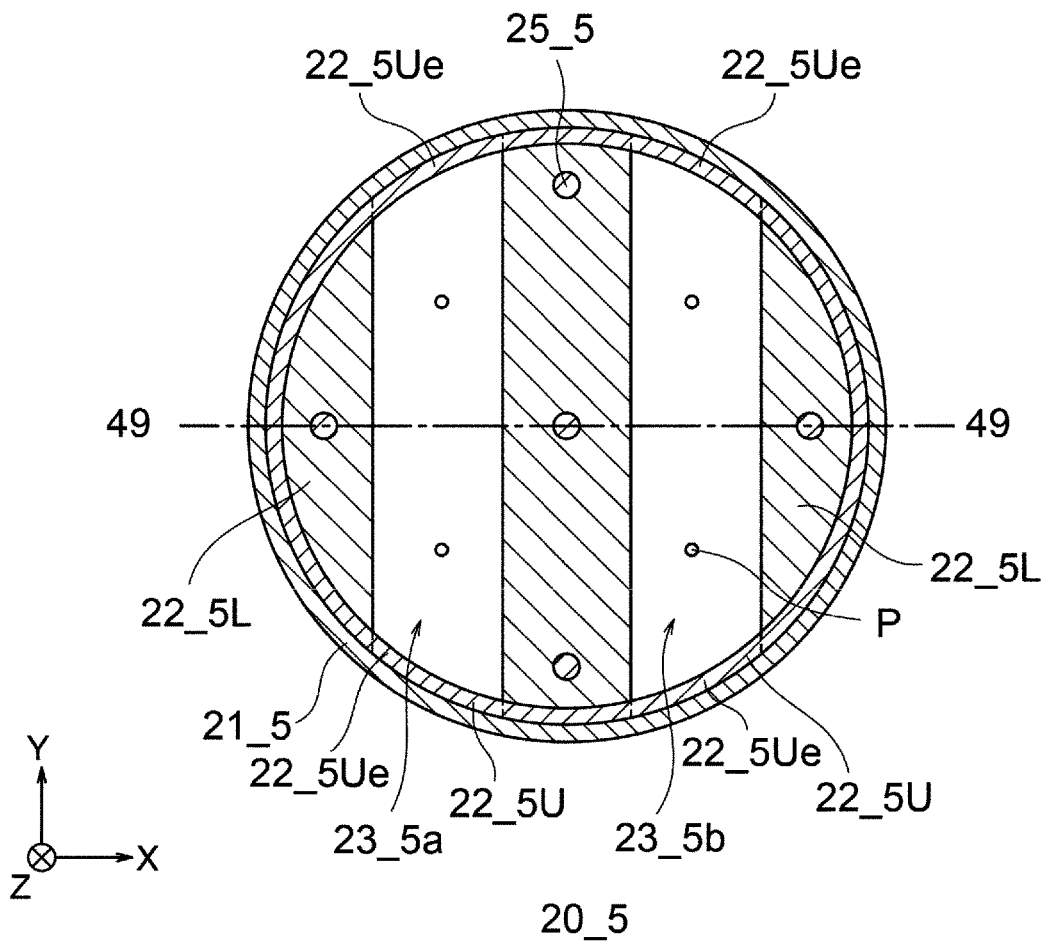
FIG. 48 is a plan view illustrating a configuration example of the carrier ring according to the sixth embodiment.
Figure 49:
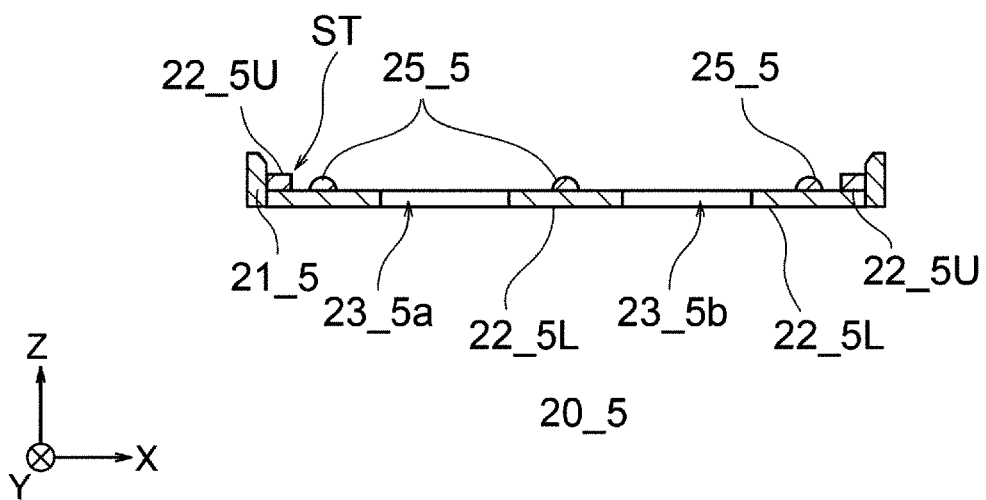
FIG. 49 is a cross-sectional view illustrating a configuration example of the carrier ring according to the sixth embodiment.
Figure 50:
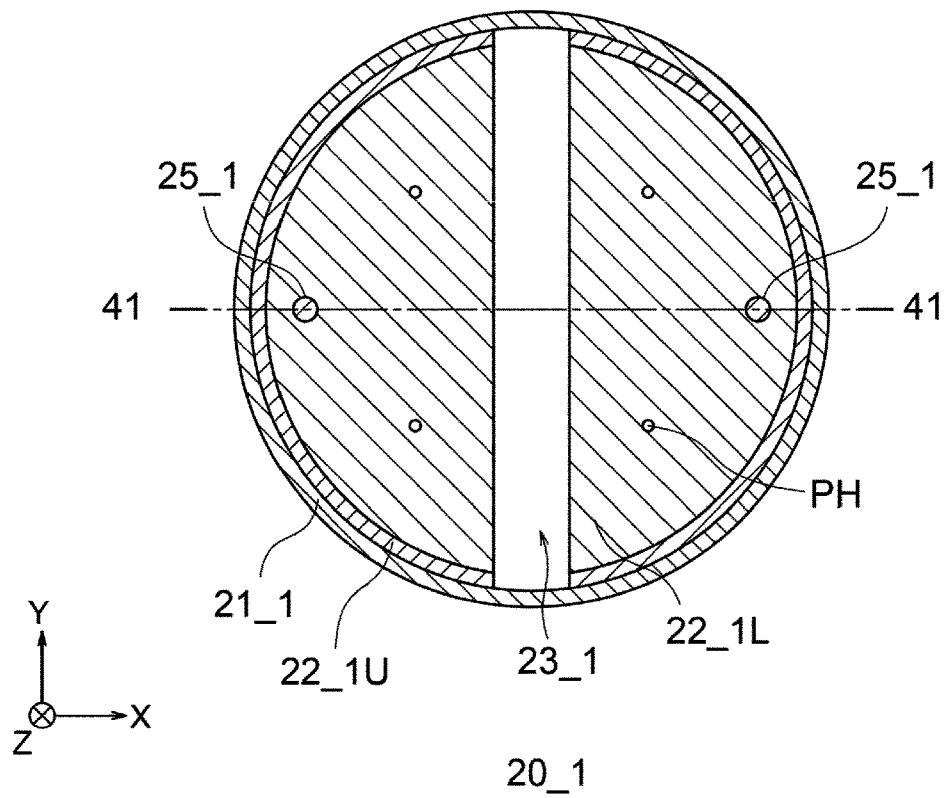
FIG. 50 is a plan view illustrating a configuration example of the carrier ring according to a seventh embodiment.
Figure 51:
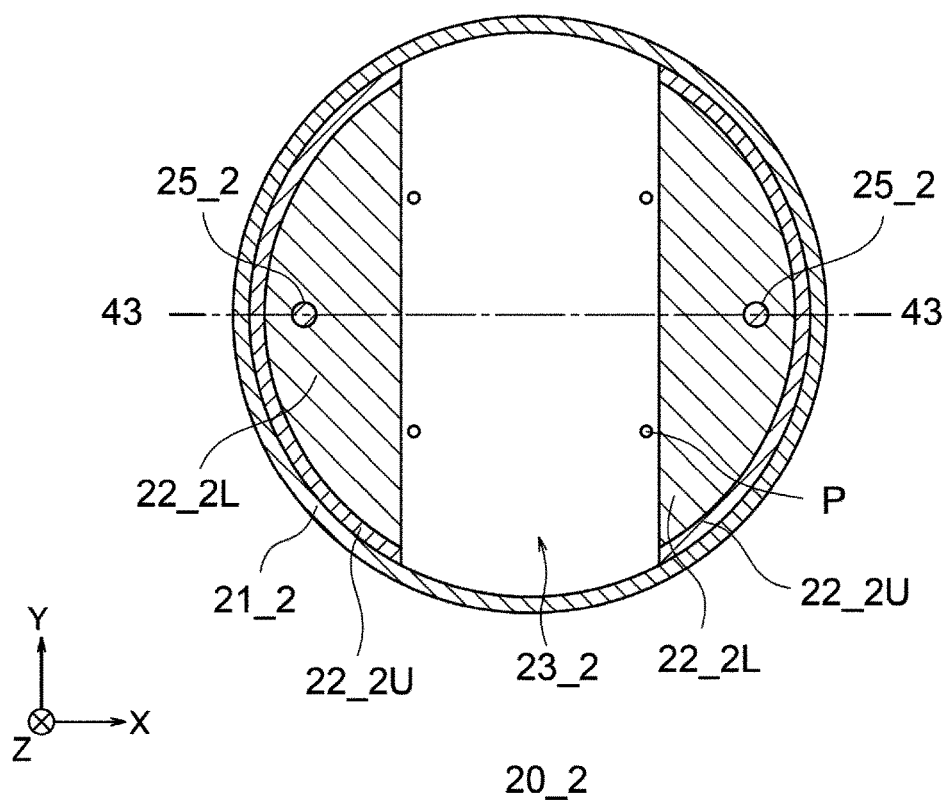
FIG. 51 is a plan view illustrating a configuration example of the carrier ring according to the seventh embodiment.
Figure 52:
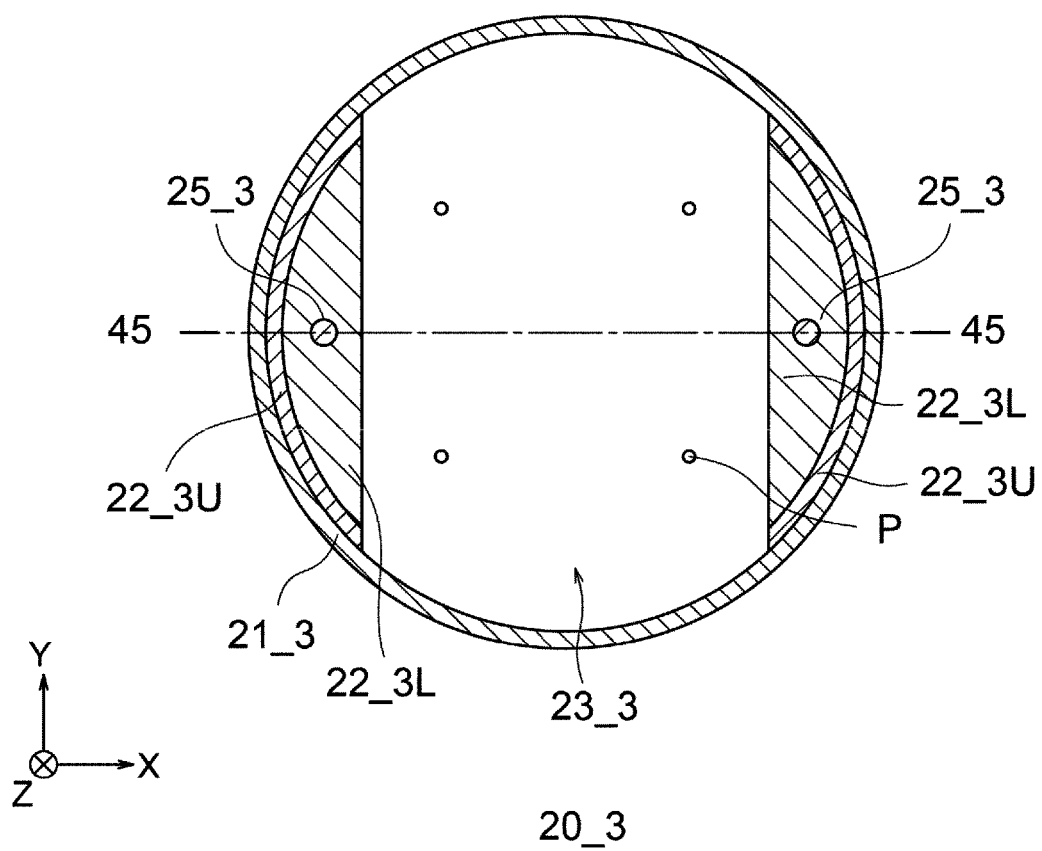
FIG. 52 is a plan view illustrating a configuration example of the carrier ring according to the seventh embodiment.
Figure 53:
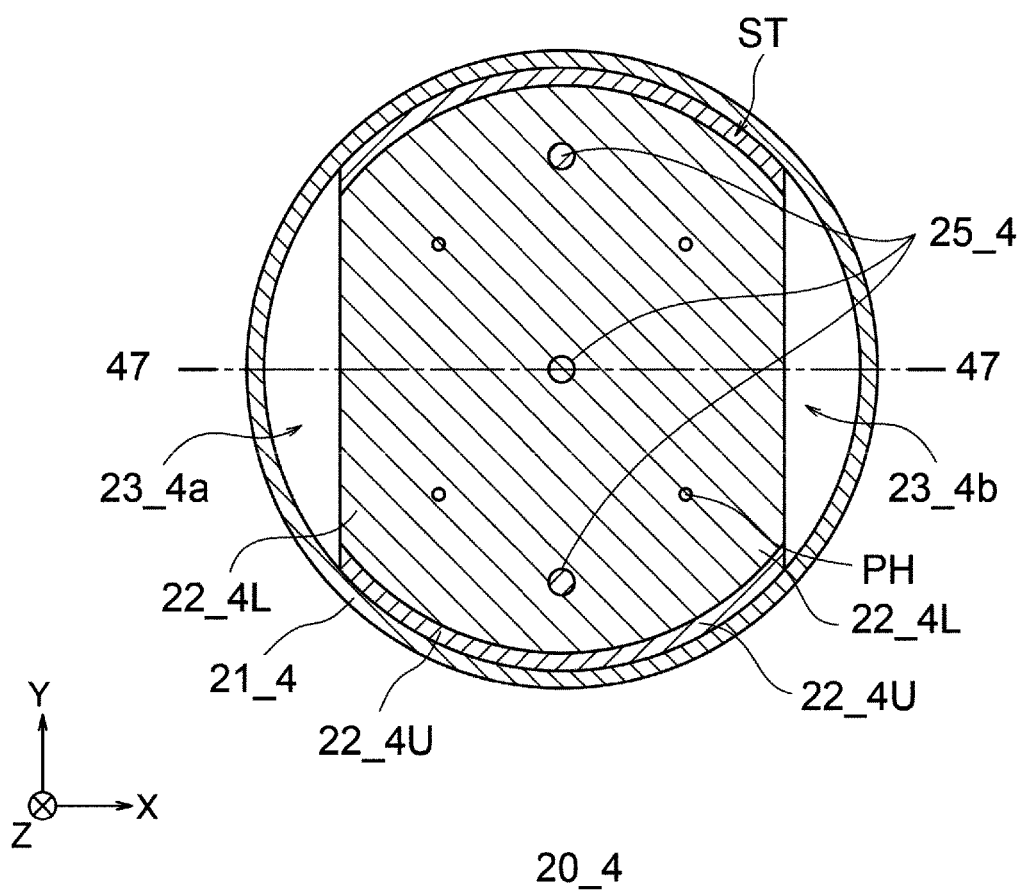
FIG. 53 is a plan view illustrating a configuration example of the carrier ring according to the seventh embodiment.
Figure 54:
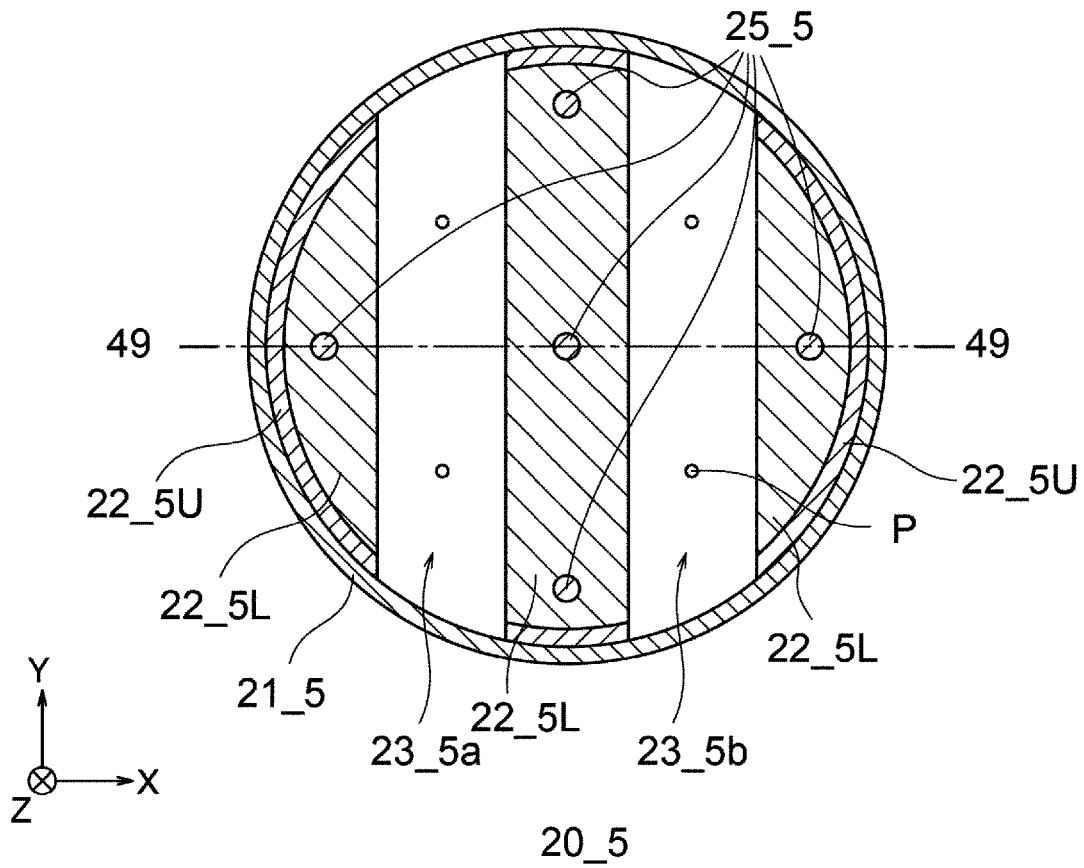
FIG. 54 is a plan view illustrating a configuration example of the carrier ring according to the seventh embodiment.

In the carrier ring 20_5 of FIGS. 48 and 49, the five protrusion portions 25_5 are disposed on the mask portion 22_5L in the extending direction of the openings 23_5a and 23_5b (the Y direction) and the direction orthogonal to the extending direction (the X direction). One of the protrusion portions 25_5 is disposed in the center of the carrier ring 20_5 and the substrate W. The four protrusion portions 25_5 are substantially evenly located on the center axis of the carrier ring 20_5 extending in the X direction and the center axis of the carrier ring 20_5 extending in the Y direction at a substantially equal distance from the center of the carrier ring 20_5 and the substrate W. The protrusion portions 25_5 have substantially the same height as the mask portion 22_5U (the height in the Z direction) and are configured with the same material as the mask portion 22_5U. Accordingly, when the substrate W is placed on the carrier ring 20_5, the protrusion portions 25_5 support the substrate W from the first surface F1 side. As a result, the substrate W can be prevented from being in contact with the mask portion 22_5L, and burrs can be prevented from being generated in the material film TF.

The rest of the configurations of the carrier rings 20_1 to 20_5 according to the sixth embodiment may be the same as those according to the fourth embodiment. Accordingly, in the sixth embodiment, the effect according to the fourth embodiment can be obtained.

Seventh Embodiment

FIGS. 50 to 54 are plan views illustrating configuration examples of the carrier rings 20_1 to 20_5 according to a seventh embodiment. Further, cross sections taken along the line 41-41, the line 43-43, the line 45-45, the line 47-47, and the line 49-49 of FIGS. 50 to 54 may be the same as the cross sections illustrated in FIGS. 41, 43, 45, 47, and 49, respectively.

The seventh embodiment is a combination of the sixth embodiment and the third embodiment.

According to the seventh embodiment, in the opening 23_1 to 23_5b of the carrier rings 20_1 to 20_5, the end portions 22_1Ue to 22_5Ue of the mask portions 22_1U to 22_5U that are the both end portions in the Y direction are not provided. The rest of the configurations of the carrier rings 20_1 to 20_5 according to the seventh embodiment are the same as those according to the sixth embodiment.

If the end portions 22_1Ue to 22_5Ue are not provided, when the material film TF is formed on the first surface F1 of the substrate W, the material film TF may be formed in the edge portion of the side surface of the substrate W. However, the areas of the substrate W corresponding to the end portions 22_1Ue to 22_5Ue are outer edge portions of the substrate W, and the unnecessary material film TF can be removed by the bevel etching process. In other words, even if the material film TF is formed in the carrier rings 20_1 to 20_5 according to the seventh embodiment, thereafter, burrs of the material film TF may be removed by the bevel etching process. Accordingly, in the seventh embodiment, the same effect as in the sixth embodiment can be obtained.

According to the fourth to seventh embodiments, contact areas between the substrate W and the mask portions 22_1U to 22_5U are relatively small, and the damage of the first surface F1 of the substrate W can be prevented.

Modification of Embodiments

Figure 55:
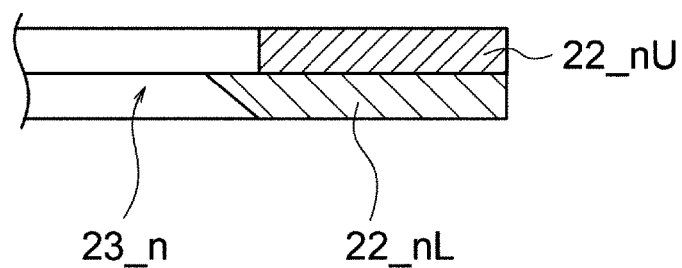
FIG. 55 is a cross-sectional view illustrating a shape of an edge portion of a mask portion.
Figure 56:
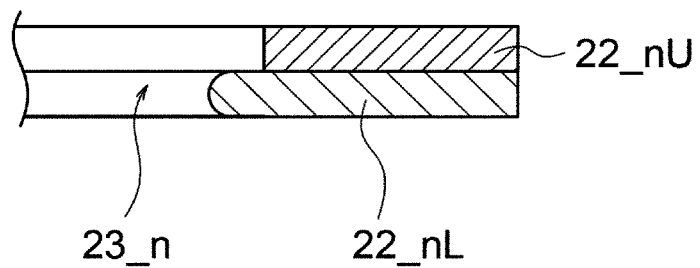
FIG. 56 is a cross-sectional view illustrating a shape of the edge portion of the mask portion.

FIGS. 55 and 56 are cross-sectional views illustrating the shapes of edge portions of mask portions 22_nL (n=1 to 5). As illustrated in FIG. 55, the edge portion of the mask portion 22_nL may be pointed at an acute angle to an opening 23_n side. Alternatively, as illustrated in FIG. 56, the edge portion of the mask portion 22_nL may be rounded. In this case, the abnormal discharge from the edge portion of the mask portion 22_nL is prevented, a damage of a component of the apparatus 1, a damage of the substrate W, and film formation abnormality of the material film TF can be prevented.

Figure 57:
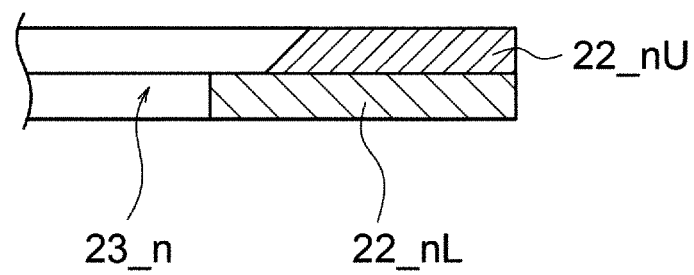
FIG. 57 is a cross-sectional view illustrating a shape of the edge portion of the mask portion.
Figure 58:
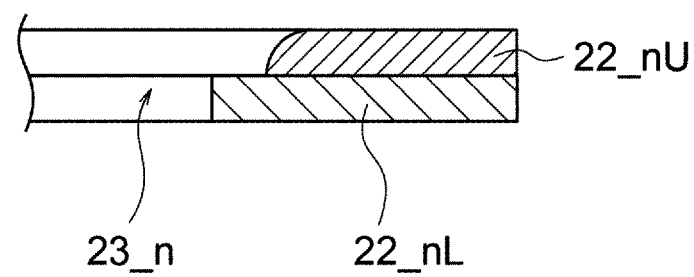
FIG. 58 is a cross-sectional view illustrating a shape of the edge portion of the mask portion.

FIGS. 57 and 58 are cross-sectional views illustrating the shapes of the edge portions of mask portions 22_nU. As illustrated in FIG. 57, the edge portion of the mask portion 22_nU may be sharp at an acute angle on the opening 23_n side. Here, a front end that is an acute angle of the mask portion 22_nU is in contact with the mask portion 22_nL. In this case, the abnormal discharge from the edge portion of the mask portion 22_nU can be prevented, damage of a component of the apparatus 1, damage of the substrate W, and film formation abnormality of the material film TF can be prevented. As illustrated in FIG. 58, the edge portion of the mask portion 22_nU may be rounded. Also, in this case, abnormal discharge from the end portion of the mask portion 22_nU is prevented, the damage of a component of the apparatus 1, the damage of the substrate W, and film formation abnormality of the material film TF can be prevented.

Figure 59:
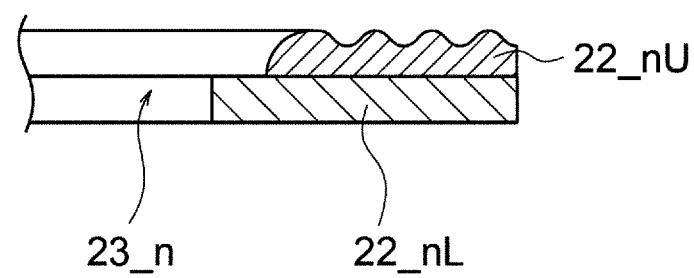
FIG. 59 is a cross-sectional view illustrating a shape of a substrate mounting surface of the mask portion.

FIG. 59 is a cross-sectional view illustrating a shape of the substrate mounting surface of the mask portion 22_nU. The surface of the mask portion 22_nU on which the substrate W is mounted may be embossed to be formed in an uneven shape. Accordingly, the damage of the first surface F1 of the substrate W can be prevented.

Configuration of Entire Apparatus 1 Including Buffer Chamber and Transfer Apparatus FIG. 60 is a diagram illustrating an example of the apparatus 1 including the buffer chamber and the transfer apparatus. A plurality of carrier rings 20_n are held in a plurality of shelves 16 as a housing unit of the carrier rings 20_n provided on a mounting table 15 in a vertical direction in a buffer chamber 7 that is close to the chamber 10 of the apparatus 1. A transfer chamber 8 is provided in adjacent to the buffer chamber 7. A transfer apparatus 17 holds the carrier ring 20_n used for forming the material film TF on the rear surface side of the substrate W in an arm of the transfer apparatus 17 and opens a gate valve 14 between the transfer chamber 8 and the chamber 10 to bring the carrier ring 20_n into the chamber 10. By selecting any carrier ring 20_n, the formation position of the material film TF with respect to the substrate W can be changed. That is, in order to form the material film TF in accordance with the warpage of the substrate W, any carrier ring 20_n can be selected and taken out. The buffer chamber 7 and the transfer chamber 8 are airtightly held.

The controller 100 of FIG. 1 performs control so that the selected carrier ring 20_n is taken out from the buffer chamber 7 by using the transfer apparatus 17 and transferred to the chamber 10. The controller 100 transfers the carrier rings 20_n in a predetermined order with reference to a recipe stored in a storage unit (not illustrated). Accordingly, the controller 100 can sequentially transfer the carrier rings 20_1 to 20_4 to the chamber 10, and form the material film TF. Alternatively, the controller 100 can sequentially transfer the carrier rings 20_1, 20_5, and 20_4 to the chamber 10 and can form the material film TF.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:
   a process container;
   a holder disposed in the process container and arranged to hold a substrate, the substrate including a first surface and a second surface on an opposite side to the first surface, the holder including a mask portion that covers a first area of the first surface and exposes a second area different from the first area;
   a gas supply configured to introduce a process gas into the process container;
   a first electrode disposed between the holder and the gas supply, the gas supply configured to supply the process gas to the first surface of the substrate; and
   a second electrode disposed on a side of the second surface of the substrate and configured to apply an electric field to the process gas between the first and second electrodes,
   wherein the mask portion includes a first layer in contact with the first surface of the substrate, and a second layer spaced further from the substrate than the first layer, and
   wherein the first layer has a first opening and the second layer has a second opening, the first opening extends further than the second opening does in a direction toward the first area above an edge portion of the mask portion, the edge portion partitions the first area and the second area.

2. The semiconductor manufacturing apparatus according to claim 1,
   wherein the first layer and the second layer are configured to form one or more steps.

3. The semiconductor manufacturing apparatus according to claim 1, wherein the holder further comprises:
   a plurality of holders, and
   respective mask portions of the plurality of holders cover respective first areas different from each other and expose respective second areas different from each other.

4. The semiconductor manufacturing apparatus according to claim 3,
   wherein the plurality of holders each include the first opening and the second opening, each of the first opening and the second opening extending in a first direction, and
   the first openings of the plurality of holders have different widths in a second direction substantially orthogonal to the first direction, and the second openings of the plurality of holders have different widths in the second direction.

5. The semiconductor manufacturing apparatus according to claim 3, further comprising:
   a housing unit arranged to accommodate the plurality of holders; and
   a transfer apparatus configured to transfer one of the plurality of holders from the housing unit into the process container.

6. The semiconductor manufacturing apparatus according to claim 1,
   wherein the first opening and the second opening extend in a first direction, and
   the first opening and the second opening are configured to form one or more steps in outer peripheries of the first layer and the second layer in a second direction substantially orthogonal to the first direction.

7. The semiconductor manufacturing apparatus according to claim 6,
   wherein the first opening and the second opening are further configured to form one or more steps in end portions of the first opening and the second opening in the first direction.

8. The semiconductor manufacturing apparatus according to claim 6,
   wherein the first and the second layers are not provided in end portions of the first opening and the second opening in the first direction.

9. The semiconductor manufacturing apparatus according to claim 1,
   wherein the first layer is provided along at least a portion of an outer edge of the holder.

10. The semiconductor manufacturing apparatus according to claim 9,
    wherein the mask portion further includes a plurality of protruding portions that are substantially evenly located on the second layer at a substantially equal distance from a center of the holder, the protruding portions having substantially a same height as the first layer.

11. The semiconductor manufacturing apparatus according to claim 1,
    wherein the holder further includes an outer edge portion surrounding the first and second layers of the mask portion, the outer edge having a thickness greater than a total thickness of the first and second layers, and protruding toward the substrate held by the holder.

12. A semiconductor manufacturing apparatus comprising:
    a process container;
    a holder disposed in the process container and arranged to hold a substrate, the substrate including a first surface and a second surface on an opposite side to the first surface, the holder including a mask portion that covers a first area of the first surface and exposes a second area different from the first area;
    a gas supply configured to introduce a process gas into the process container;

a first electrode disposed between the holder and the gas supply, the gas supply configured to supply the process gas to the first surface of the substrate; and a second electrode disposed on a side of the second surface of the substrate and configured to apply an electric field to the process gas between the first and second electrodes, wherein the mask portion includes a first layer in contact with the first surface of the substrate, and a second layer spaced further from the substrate than the first layer, the first layer is disposed along at least a portion of an outer edge of the holder, and the second layer is at least partially disposed in an area surrounded by the outer edge in the holder correspondingly to the first area.

13. The semiconductor manufacturing apparatus according to claim 12, wherein the first layer and the second layer are configured to form one or more steps.

14. The semiconductor manufacturing apparatus according to claim 12, wherein the holder further comprises:

a plurality of holders, and respective mask portions of the plurality of holders cover respective first areas different from each other and expose respective second areas different from each other.

15. The semiconductor manufacturing apparatus according to claim 14, wherein the first layer has a first opening and the second layer has a second opening, the second opening being disposed in the mask portion correspondingly to the second area and extending in a first direction, and the second openings of the plurality of holders have different widths in a second direction substantially orthogonal to the first direction.

16. The semiconductor manufacturing apparatus according to claim 14, further comprising:

a housing unit configured to accommodate the plurality of holders, and a transfer apparatus configured to transfer one of the plurality of holders from the housing unit into the process container.

17. The semiconductor manufacturing apparatus according to claim 12:

wherein the mask portion further includes a plurality of protruding portions that are substantially evenly located on the second layer at a substantially equal distance from a center of the holder, the protruding portions having substantially a same height as the first layer.

18. The semiconductor manufacturing apparatus according to claim 12, wherein the first layer has a first opening and the second layer has a second opening, the second opening being disposed in the mask portion correspondingly to the second area and extending in a first direction, and the first layer is disposed in an end portion of the second opening in the first direction.

19. The semiconductor manufacturing apparatus according to claim 12, wherein the first layer has a first opening and the second layer has a second opening, the second opening being disposed in the mask portion correspondingly to the second area and extending in a first direction, and the first layer is not provided in an end portion of the second opening in the first direction.

20. The semiconductor manufacturing apparatus according to claim 12, wherein the holder further includes an outer edge portion surrounding the first and second layers of the mask portion, the outer edge portion having a thickness greater than a total thickness of the first and second layers, and protruding toward the substrate held by the holder.

* * * * *